(12) United States Patent
Nagatomi et al.

(10) Patent No.: US 8,048,338 B2
(45) Date of Patent: *Nov. 1, 2011

(54) PHOSPHOR, PHOSPHOR SHEET, AND MANUFACTURING METHOD THEREFORE, AND LIGHT EMISSION DEVICE USING THE PHOSPHOR

(75) Inventors: Akira Nagatomi, Tokyo (JP); Kenji Sakane, Tokyo (JP)

(73) Assignees: Dowa Electronics Materials Co., Ltd., Tokyo (JP); Mitsubishi Chemical Corporation, Tokyo (JP)

( * ) Notice: Subject to any disclaimer, the term of this patent is extended or adjusted under 35 U.S.C. 154(b) by 722 days.

This patent is subject to a terminal disclaimer.

(21) Appl. No.: 11/887,654

(22) PCT Filed: Mar. 30, 2006

(86) PCT No.: PCT/JP2006/306756
§ 371 (c)(1),
(2), (4) Date: Oct. 17, 2007

(87) PCT Pub. No.: WO2006/106883
PCT Pub. Date: Oct. 12, 2006

(65) Prior Publication Data
US 2009/0026915 A1    Jan. 29, 2009

(30) Foreign Application Priority Data

Mar. 31, 2005 (JP) ................................. 2005-102427
Sep. 5, 2005 (JP) ................................. 2005-257169
Dec. 28, 2005 (JP) ................................. 2005-380323

(51) Int. Cl.
*C09K 11/64* (2006.01)
(52) U.S. Cl. ............. 252/301.4 F; 252/301.36; 257/98; 313/503; 313/486
(58) Field of Classification Search ............ 252/301.4 F, 252/301.36; 313/503, 486; 257/98
See application file for complete search history.

(56) References Cited

U.S. PATENT DOCUMENTS

| | | | | |
|---|---|---|---|---|
| 5,998,925 A * | 12/1999 | Shimizu et al. | ............... | 313/503 |
| 6,809,781 B2 * | 10/2004 | Setlur et al. | ..................... | 349/70 |
| 7,443,094 B2 * | 10/2008 | Sakane et al. | ................. | 313/503 |
| 7,445,730 B2 * | 11/2008 | Nagatomi et al. | ...... | 252/301.4 F |
| 2003/0052595 A1 | 3/2003 | Ellens et al. | | |

FOREIGN PATENT DOCUMENTS

| | | |
|---|---|---|
| JP | A-2003-096446 | 4/2003 |
| JP | A-2003-203504 | 7/2003 |
| JP | A-2005-048105 | 2/2005 |
| JP | A-2005-112922 | 4/2005 |
| WO | WO 2005/033247 A1 | 4/2005 |

OTHER PUBLICATIONS

Office Action issued Mar. 9, 2011, in Chinese Patent Application No. 200680010489.4 (with English-language translation).

Taiwanese Office Action issued on Jan. 14, 2011 in corresponding Taiwanese Application No. 095111455 (with an English Translation).

* cited by examiner

*Primary Examiner* — Carol M Koslow

(74) *Attorney, Agent, or Firm* — Oblon, Spivak, McClelland, Maier & Neustadt, L.L.P.

(57) ABSTRACT

To provide a phosphor having a broad emission spectrum in a range of blue color (in a peak wavelength range from 400 nm to 500 nm), having a broad flat excitation band in a near ultraviolet/ultraviolet range, and having excellent emission efficiency and emission intensity/luminance. The phosphor is given as a general composition formula expressed by $M_mA_aB_bO_oN_n:Z$, (where element M is the element having bivalent valency, element A is the element having tervalent valency, element B is the element having tetravalent valency, O is oxygen, N is nitrogen, and element Z is more than one kind of element acting as an activator), satisfying $5.0<(a+b)/m<9.0$, $0 \leq a/m \leq 2.0$, $0 \leq o \leq n$, $n=2/3m+a+4/3b-2/3o$, and has an emission spectrum with a maximum peak in the wavelength range from 400 nm to 500 nm under an excitation of the light in a wavelength range from 250 nm to 430 nm.

33 Claims, 12 Drawing Sheets

(A)        (B)

(A)

(B)

(C)

PHOSPHOR, PHOSPHOR SHEET, AND MANUFACTURING METHOD THEREFORE, AND LIGHT EMISSION DEVICE USING THE PHOSPHOR

This application is a 371 of PCT/JP2006/306756, filed Mar. 30, 2006.

TECHNICAL FIELD

The present invention relates to a phosphor containing nitrogen, a phosphor mixture, and a phosphor sheet, used for a cathode-ray tube (CRT), a display such as a field emission display (FED) and a plasma display (PDP), and an illumination device such as a fluorescent lamp and a fluorescent display tube, and an illumination device such as a crystal liquid back light and a method of manufacturing therefore, and also to a light emission device such as a white LED illumination in which, a semiconductor light emitting element (LED) and this phosphor are combined.

BACKGROUND ART

At present, a discharge type fluorescent lamp and an incandescent bulb used as the illumination device involve problems that a harmful substance such as mercury is contained, and life span is short. However, in recent years, a high luminescence LED emitting light of near ultraviolet/ultraviolet to blue color has been developed in sequence, and the white LED illumination for the practical application of the next generation has been actively studied and developed, in which the white light is created by mixing the light of the near ultraviolet/ultraviolet to blue color generated from the LED and the light generated from the phosphor having an excitation band in a wavelength region thereof. When the white LED illumination is put to practical use, since efficiency of converting electric energy into light is improved, less heat is generated and it is constituted of the LED and a phosphor, the white LED has advantages of good life span without burn-out of a filament like a conventional incandescent bulb and the harmful substance such as mercury is not contained, and miniaturization of the illumination device is realized, thus realizing an ideal illumination device.

A white LED illumination system creating white light by combining the high luminance LED and the phosphor is called one chip system. This one chip system has an advantage that it has excellent color rendering properties and can be manufactured at a low cost, compared to a multi-chip type system which creates white color by using three primary color LEDs such as high luminance red LED, green LED, and blue LED, and is focused as an illumination of the next generation.

As the white LED illumination of the one chip system, there is one that combines the high luminance blue LED and the phosphor emitting yellow light under an excitation of blue emitting light generated from the LED, and for example, which is obtained by combining the high luminance blue LED, in which an InGaN material is used, and garnet yellow phosphors such as $(Y, Gd)_3(Al, Ga)_5O_{12}:Ce(YAG:Ce)$, $Tb_3Al_5O_{12}:Ce$, and $Ca_3Sc_2Si_3O_{12}:Ce$. In the white LED illumination, white color is obtained by using a complementary relation between blue emission of the LED and yellow emission of the phosphor. However, the problem of the white LED illumination is that the emission on the long-wavelength side of visible light range, specifically the emission of red color component is insufficient although the white LED illumination has a high luminance, thereby deteriorating in the color rendering properties which are essential factors of illumination. However, in recent years, the nitrogen-containing phosphor having an excitation spectrum with a peak in the wavelength range from yellow color to red color, and having an emission spectrum with a peak in a broad range, and also having a good excitation band in a range from near ultraviolet/ultraviolet to blue color, has been developed in sequence. Then, by adding such a phosphor, the color rendering properties are improved. As such phosphors containing nitrogen, $Ca_2Si_5N_8:Eu$, $Sr_2Si_5N_8:Eu$, $Ba_2Si_5N_8:Eu$, $Ca_x(Al, Si)_{12}(O, N)_{16}:Eu$ $(0<x \leqq 1.5)$, $(Ca, Sr, Ba)Si_2O_2N_2:Eu$, $CaAl_2Si_4N_8:Eu$, $CaSiN_2:Eu$, $CaAlSiN_3:Eu$ are typically given as examples.

However, problems are involved in the white LED illumination, in which the high luminance blue LED and the garnet yellow phosphor are combined, such that the garnet yellow phosphor does not have a flat broad excitation band near the excitation wavelength of 460 nm, there are variances in the emission intensity and the peak wavelength of the high luminance blue LED, and a balance of the emission intensity of blue color and yellow color is lost, thereby changing a color tone of the white light, because the emission intensity of transmitted blue light depending on a film thickness is changed when the phosphor is applied on the LED.

In order to solve the above-described problem, at present, a white LED illumination system is actively studied. In such a white LED illumination system, white color is obtained by using the light in a mixed state of the near ultraviolet/ultraviolet emitting LED and the red (R) color emitting phosphor, the green (G) color emitting phosphor, and the blue (B) color emitting phosphor obtained by being excited by the light of the near ultraviolet/ultraviolet light generated from the LED. This system has an advantage that an arbitrary emission color can be obtained in addition to white light by the combination of the R, G, B, and the mixing ratio, white emission is obtained not by the complementary relation of light but by the mixing state of light, and by using the R, G, B and other phosphors having broad emission spectra, the emission spectrum which is approximated the spectrum of the sun-light is obtained compared to the white LED system obtained by combining the high luminance blue LED and the garnet yellow phosphor, and the color rendering properties are possibly improved. Further, even when there is a variance in the emission intensity and the peak wavelength as is seen in the high luminance blue LED, a phenomenon of changing the color tone of the white light does not occur, because the near ultraviolet/ultraviolet light is not used in the mixing state of the light. In addition, even when the phosphor is applied on the near ultraviolet/ultraviolet LED, the change of the emission intensity of the near ultraviolet/ultraviolet light transmitting therethrough has no influence on the color tone, and therefore the white LED illumination with excellent color rendering properties and small in variance of the color tone can be prepared.

Then, as the phosphor used for such an application, examples are given such as $Y_2O_2S:Eu$, $La_2O_2S:Eu$, $3.5MgO.0.5MgF_2.GeO_2:Mn$, $(La, Mn, Sm)_2O_2S.Ga_2O_3:Eu$ for the red phosphor, $ZnS:Cu,Al$, $CaGa_2S_4:Eu$, $SrGa_2S_4:Eu$, $BaGa_2S_4:Eu$, $SrAl_2O_4:Eu$, $BAM:Eu,Mn$, $(Ba, Sr, Ca)_2SiO_4:Eu$, for the green phosphor, and $BAM:Eu$, $Sr_5(PO_4)_3Cl:Eu$, $ZnS:Ag$, $(Sr, Ca, Ba, Mg)_{10}(PO_4)_6Cl_2:Eu$ for the blue phosphor. In the phosphor containing nitrogen as described above, $Ca_2Si_5N_8:Eu$, $Sr_2Si_5N_8:Eu$, $Ba_2Si_5N_8:Eu$, $Ca_x(Al,Si)_{12}(O,N)_{16}:Eu(0<x \leqq 1.5)$, $(Ca, Sr, Ba)Si_2O_2N_2:Eu$, $CaAl_2Si_4N_8:Eu$, $CaSiN_2:Eu$, $CaAlSiN_3:Eu$ and so forth have emission spectra with high efficient excitation band even in the near ultraviolet/ultraviolet and broad peaks, and therefore have improved luminance and color rendering properties even in the white LED illumination obtained by combining the near ultraviolet/ultraviolet LED and the R,G,B and other phosphor. However, there is no high efficient and high luminance R,G,B and other phosphor such as the YAG:Ce phosphor used in combination with the high luminance blue LED and the garnet yellow phosphor, and therefore a satisfactory white LED illumination can not be obtained.

Therefore, in regards to the phosphor of each color, a new phosphor having an excellent emission characteristic has been developed, and in regards to the blue phosphor also, a new blue phosphor surpassing the present BAM:Eu, $Sr_5(PO_4)_3$ Cl:Eu, ZnS:Ag, $(Sr, Ca, Ba, Mg)_{10}(PO_4)_6Cl_2$:Eu has been actively developed. In recent years, nitrogen-containing $La_{1-x}Si_3N_5:Ce_x$ (for example, see patent document 1) is reported.

(Patent document 1) Japanese Patent Laid-Open No. 2003-96446

DISCLOSURE OF THE INVENTION

Problem to be Solved

However, although the nitrogen-containing phosphor of the aforementioned patent document 1 has the emission spectrum with a broad peak, the emission intensity under the excitation of the excitation light of near ultraviolet/ultraviolet does not meet a satisfactory level, and therefore a sufficient emission intensity and luminance can not be obtained. Thus, the phosphor of the patent document 1 is considered to be inadequate to be used in the light emission device.

In view of the above-described problems, the present invention is provided, and an object of the present invention is to provide a phosphor having a broad emission spectrum in a range of blue color (in a peak wavelength range from 400 nm to 500 nm), having a flat broad excitation band in the range of the near ultraviolet/ultraviolet, and having an excellent emission efficiency, emission intensity, and luminance, a method of manufacturing therefore, and a light emission device such as white LED illumination using the phosphor.

Means for Solving the Problem

In order to solve the above-described problem, after studying on a phosphors of various kinds of composition containing nitrogen, it was found that a new blue phosphor containing nitrogen expressed by the following general composition formula is obtained, by optimizing a constituent element, the molar ratio of the constituent element, and firing conditions.

Then, the present invention takes several aspects as follows.

In a first aspect, a phosphor is provided, which is given as a general composition formula expressed by MmAaDbOoNn:Z, (where element M is one or more than one kind of element having bivalent valency, element A is one or more than one kind of element having tervalent valency, element D is one or more than one kind of element having tetravalent valency, O is oxygen, N is nitrogen, and element Z is one or more than one kind of element acting as an activator), satisfying $5.0<(a+b)/m<9.0$, $0\leq a/m\leq 2.0$, $0\leq o\leq n$, $n=2/3m+a+4/3b-2/3o$, and having an emission spectrum with a maximum peak in the wavelength range from 400 nm to 500 nm under an excitation of the light in a wavelength range from 250 nm to 430 nm.

In all succeeding embodiments herein M, A, D, and Z may be one or more than one kind of element listed.

In a second aspect, the phosphor according to the first aspect is provided, which is given as the composition formula expressed by $0.0\leq a/m\leq 2.0$, $4.0\leq b/m\leq 8.0$, $6.0\leq(a+b)/m\leq 8.0$, $0<o/m\leq 3.0$.

In a third aspect, the phosphor according to the first aspect or the second aspect is provided, which is given as the composition formula expressed by $a=x\times m$, $b=(6-x)\times m$, $o=(1+x)\times m$, $n=(8-x)\times m$, when satisfying $0\leq x\leq 2$.

In a fourth structure, the phosphor according to any one of the first to third aspects is provided, wherein under excitation by a monochromatic light in the wavelength range from 350 nm to 430 nm, when a maximum emission intensity in the wavelength range from 400 nm to 500 nm is defined as $P_{max}$, and a minimum emission intensity is defined as $P_{min}$ in this range, $P_{min}/P_{max}$ is $\geq 0.3$.

In a fifth structure, the phosphor according to any of the first to fourth aspects is provided, wherein an element M is more than one kind of element selected from the group consisting of Mg, Ca, Sr, Ba, Zn and rare earth elements having bivalent valency, an element A is more than one kind of element selected from the group consisting of Al, Ga, In, Tl, Y, Sc, P, As, Sb, and Bi, the element D is more than one kind of element selected from the group consisting of Si, Ge, Sn, Ti, Hf, Mo, W, Cr, Pb, Zr, and the element Z is more than one kind of element selected from the group consisting of rare earth elements and transitional metal elements.

In a sixth aspect, the phosphor according to any one of the first to fifth aspects is provided, wherein the element M is more than one kind of element selected from the group consisting of Mg, Ca, Sr, Ba, Zn, the element A is more than one kind of element selected from the group consisting of Al, Ga, In, the element D is Si and/or Ge, and the element Z is more than one kind of element selected from the group consisting of Eu, Ce, Pr, Tb, and Mn.

In a seventh aspect, the phosphor according to any one of first to sixth aspects is provided, wherein the element M is Sr, the element A is Al, the element D is Si, and the element Z is Eu.

In an eighth aspect, the phosphor according to any one of the first to seventh aspects is provided, wherein when the general formula is expressed by MmAaDbOoNn:Zz, the value of $z/(m+z)$, which is a molar ratio of the element M to the element Z, is 0.0001 or more and 0.5 or less.

In a ninth aspect, the phosphor according to any one of the first to eighth aspects is provided, containing Sr of 16.0 to 25.0 wt %, Al of 2.0 to 9.0 wt %, O of 0.5 to 11.5 wt %, N of 23.0 to 32.0 wt %, and Eu of 0 to 3.5 wt %, wherein when the phosphor is irradiated with the light in the wavelength range from 250 nm to 430 nm, the maximum peak wavelength in the emission spectrum is in a range from 400 nm to 500 nm.

In a tenth aspect, the phosphor according to any one of the first to ninth aspects is provided, wherein in an X-ray diffraction pattern by a powder method using CoKα ray, a diffraction peak with highest intensity is shown in a Bragg angle (2θ) range from 35° to 37°, and further in the Bragg angle (2θ) range from 23.6° to 25.6°, 33° to 35°, 39.7° to 40.7°, and 43° to 44° of an X-ray diffraction pattern by the powder method, two, two, one, and one characteristic diffraction peaks are shown, respectively and when a relative intensity of the diffraction peak with highest intensity observed in the Bragg angle (2θ) range from 35° to 37° is defined as 100%, the relative intensity of the diffraction peaks is not less than 2.0%, and not more than 40%.

In an eleventh aspect, the phosphor according to any one of the first to tenth aspects is provided, wherein a crystal of a product phase contained in this phosphor has a structure of an orthorhombic system.

In a twelfth aspect, the phosphor according to any one of the first to eleventh aspects is provided, wherein a unit volume of a crystal lattice of the product phase contained in this phosphor is not less than 345 Å$^3$ and not more than 385 Å$^3$.

In a thirteenth aspect, the phosphor according to any one of the first to eleventh aspects is provided, wherein the unit volume of the crystal lattice of the product phase contained in this phosphor is not less than 353 Å$^3$ and not more than 385 Å$^3$.

In a fourteenth aspect, the phosphor according to any one of the first to thirteenth aspects is provided, wherein lattice constants of the crystal lattice of the product phase contained in this phosphor are defined as that a is in a range from 7.85 Å to 8.28 Å, b is in a range from 9.26 Å to 9.58 Å, and c is in a range from 4.80 Å to 4.92 Å.

In a fifteenth aspect, the phosphor according to any one of the first to fourteenth aspects is provided, wherein a crystallite size (Dx) of the product phase contained in this phosphor particle is 50 nm or more.

In a sixteenth aspect, the phosphor according to any one of the first to fourteenth aspects is provided, wherein the crystallite size (Dx) of the product phase contained in this phosphor particle is 80 nm or more.

In a seventeenth aspect, the phosphor according to any one of the first to sixteenth aspects is provided, containing a primary particle with particle size of 50 μm or less and aggregates in which the primary particle agglutinates, wherein an average particle size (D50) of the powdery phosphor containing the primary particle and the aggregates is 1.0 μm or more and 50.0 μm or less.

In an eighteenth aspect, a method of manufacturing the phosphor according to any one of the first to seventeenth aspects is provided, including the steps of obtaining a mixture by weighing and mixing powdery raw materials of this phosphor;

obtaining a fired product by firing the mixture in a firing furnace; and obtaining the phosphor by pulverizing the fired product, wherein in the step of obtaining the fired product by firing the mixture, any one of nitrogen, inert gas such as rare gas, ammonia, mixed gas of ammonia and nitrogen, or mixed gas of nitrogen and hydrogen is used as atmosphere gas during firing.

In a nineteenth aspect, the method of manufacturing the phosphor according to the eighteenth aspect is provided, wherein gas containing 80% or more of nitrogen gas is used as the atmosphere gas in the firing furnace.

In a twentieth aspect, the method of manufacturing the phosphor according to the eighteenth aspect or the nineteenth aspect is provided, wherein in the step of obtaining the fired product by firing the mixture in the firing furnace, firing of the mixture is performed twice, and between firings, pulverizing and mixing of a fired mixture is performed.

In a twenty-first aspect, the method of manufacturing the phosphor according to any one of the eighteenth to twentieth aspects is provided, wherein in the step of obtaining the fired product by firing the mixture in the firing furnace, the firing is performed while circulating the atmosphere gas in the firing furnace set at 0.1 ml/min or more.

In a twenty-second aspect, the method of manufacturing the phosphor according to the twenty-first aspect is provided, wherein first, firing is performed while circulating the atmosphere gas in the firing furnace set at 0.1 ml/min or more, and next, firing is performed without circulating the atmosphere gas in the firing furnace.

In a twenty-third aspect, the method of manufacturing the phosphor according to any one of the eighteenth to twenty-second aspects is provided, wherein in the step of obtaining the fired product by firing the mixture in the firing furnace, the atmosphere gas in the firing furnace is set in a pressurization state of 0.001 MPa or more and 11.0 MPa or less.

In a twenty-fourth aspect, the method of manufacturing the phosphor according to any one of the eighteenth to twenty-third aspects is provided, wherein a crucible composed of nitride is used as a firing crucible.

In a twenty-fifth aspect, a phosphor sheet is provided, wherein the phosphor according to any one of the first to seventeenth aspects is dispersed in a resin or glass.

In a twenty-sixth aspect, an emission device is provided, having the phosphor of any one of the first to seventeenth aspects or the phosphor sheet of the twenty-fifth aspect, and an emission part emitting light with a first wavelength, for emitting light with the wavelength different from the first wavelength from the phosphor, with a part or all of the light with the first wavelength as an excitation light.

In a twenty-seventh aspect, the emission device according to the twenty-sixth aspect is provided, wherein the first wavelength is the wavelength from 250 nm to 430 nm.

In a twenty-eighth aspect, the emission device according to the twenty-sixth or twenty-seventh aspect is provided, wherein the correlated color temperature of the emission device is in a range from 10000K to 2000K.

In a twenty-ninth aspect, the emission device according to the twenty-sixth or twenty-seventh aspect is provided, wherein a correlated color temperature of the emission device is in a range from 7000K to 2500K.

In a thirtieth aspect, the emission device according to any one of the twenty-sixth to twenty-ninth aspect is provided, wherein an average color rendering index Ra of the emission device is 80 or more.

In a thirty-first aspect, the emission device according to any one of the twenty-sixth to thirtieth aspect is provided, wherein a special color rendering index R15 of the emission device is 80 or more.

In a thirty-second aspect, the emission device according to any one of the twenty-sixth to thirty-first aspect is provided, wherein the special color rendering index R9 of the emission device is 60 or more.

In a thirty-third aspect, the emission device according to any one of the twenty-sixth to thirty-second aspect is provided, wherein the emission part emitting light with the first wavelength is a light emission device (LED).

Advantage of the Invention

According to the phosphor of any one of the first to sixteenth aspect, the phosphor has a high efficient excitation band in the rage of near ultraviolet/ultraviolet, and when the phosphor is excited by the light in the range of the near ultraviolet/ultraviolet, the phosphor has the emission spectrum in the range of blue color (with a peak wavelength in the range from 400 nm to 500 nm). Therefore, the phosphor having excellent emission efficiency, emission intensity, and luminance can be provided.

According to the phosphor of the seventeenth aspect, the obtained phosphor is in a powdery state. Therefore, pulverizing is easy and the phosphor can be applied to various places as a paste. In addition, the average particle size (D50) of this phosphor is not less than 1.0 μm and not more than 50.0 μm, and therefore an application density can be increased and an application film with high emission intensity and luminance can be obtained.

According to the method of manufacturing the phosphor of any one of the eighteenth to twenty-fourth aspect, the phosphor of any one of the first to seventeenth aspect can be easily manufactured at a low manufacturing cost.

According to the phosphor sheet of the twenty-fifth aspect, various emission devices can be easily manufactured by combining the phosphor sheet and various emission parts.

According to the emission device of any one of the twenty-sixth to thirty-third aspects, the emission device with high emission intensity, luminance, and high efficiency, having desired emission color can be obtained.

DESCRIPTION OF PREFERRED EMBODIMENTS OF THE INVENTION

Embodiments of the present invention will be explained hereunder. However, the present invention is not limited thereto.

A phosphor according to this embodiment has a matrix composition given as a general formula expressed by $M_mA_aD_bO_oN_n:Z$. Here, element M is more than one kind of element selected from the elements having bivalent valency in the phosphor. The element A is more than one kind of element having tervalent valency, element D is more than one kind of element having tetravalent valency, O is oxygen, N is nitrogen, and element Z is the element acting as the activator in the phosphor and is more than one kind of elements selected from rare earth elements or transition metal elements.

Further, in the phosphor, $(a+b)/m$ is in the range satisfying $5.0<(a+b)/m<9.0$, and $a/m$ is in the range satisfying $0 \leq a/m \leq 2.0$, the relation between oxygen and nitrogen is in the range satisfying $0 \leq o<n$, and nitrogen is expressed by $n=2/3m+a+4/3b-2/3o$.

The phosphor of this embodiment having the aforementioned characteristics has a high efficient excitation band in the range of the near ultraviolet/ultraviolet, and has an emission spectrum with a broad peak under an excitation of a part or the whole part of light having a wavelength range from 250 nm to 430 nm, with a maximum peak wavelength in the range from 400 nm to 500 nm, whereby a high efficient light emission can be obtained. Therefore, by mixing the phosphor and the phosphor of other suitable color, and by combining with the light emitting part such as the near ultraviolet/ultraviolet LED, the high efficient light emission device having a desired emission color and high emission intensity and luminance can be obtained.

The phosphor of this embodiment has not only the excellent emission intensity and luminance compared to a phosphor $La_{1-x}Si_3N_5:Ce_x$ containing nitrogen as has been reported heretofore (for example, see patent document 1), but also exhibits excellent emission characteristics, when compared to BAM:Eu, $Sr_5(PO_4)_3Cl$:Eu, ZnS:Ag, (Sr, Ca, Ba, Mg)$_{10}$(PO$_4$)$_6$Cl$_2$:Eu, which are used as a white LED illuminating blue phosphor at present, to thereby make it possible to manufacture the white LED illumination having further high luminance.

An oxide phosphor BAM:Eu and a halophosphate phosphor SCAP:Eu used at present have excitation bands which rapidly fall, on the longer wavelength side of the wavelength of 380 nm or more, which is the near ultraviolet/ultraviolet region. Meanwhile, the phosphor of this example contains nitrogen and therefore has a large ratio of covalent bonding compared to the oxide phosphor, and has an excellent excitation band up to the longer wavelength side, compared to the oxide phosphor and the halophosphate phosphor used at present. Therefore, when the white LED illumination is manufactured by combining with the near ultraviolet/ultraviolet LED, the variance in the color tone of the white light can be suppressed.

The phosphor of this embodiment has the high efficient excitation band in the range of the near ultraviolet/ultraviolet, and has the emission spectrum with a broad peak, with the maximum peak wavelength in the range from 400 nm to 500 nm, under the excitation of the light in the wavelength range from 250 nm to 430 nm, whereby the high efficient light emission can be obtained. Although a detailed reason is not unclear, it can be substantially considered as follows.

First, in the phosphor of this embodiment expressed by the general composition formula $M_mA_aD_bO_oN_n:Z$, by setting the values of m, a, b, o, and n in the range of $5.0<(a+b)/m<9.0$, $0 \leq a/m \leq 2.0$, $0 \leq o<n$, $n=2/3m+a+4/3b-2/3o$, the activator serving as the center of light emission can regularly exist in a distance not allowing concentration quenching to occur in a crystal structure of the phosphor, and an excitation energy used for light emission, which is given by the excitation light, is efficiently transferred. This contributes to improving the emission efficiency.

Further, when the phosphor is thus constituted, chemically stable composition is thereby realized. Therefore, an impurity phase not contributing to light emission is hardly generated, and it appears that deterioration in emission intensity is suppressed. In other words, when a plurality of impurity phases are generated, the phosphor per unit area is decreased, and further the emission efficiency is deteriorated and the high emission intensity is not obtained, when the impurity phases thus generated absorb the excitation light and the light generated from the phosphor.

Specifically, when $(a+b)/m$ is in the range of $5.0<(a+b)/m<9.0$, and $a/m$ is in the range of $0 \leq a/m \leq 2.0$, preferably a phase emitting yellow color and orange color as an impurity phase is prevented from generating, and the emission intensity of blue color is prevented from deteriorating. In addition, when the relation between oxygen and nitrogen is in the range of $0 \leq o<n$, it is possible to prevent vitrifying that occurs when the molar ratio of the oxygen becomes larger than the molar ratio of the nitrogen. Therefore, preferably, crystallinity is not deteriorated, and the emission intensity is prevented from deteriorating.

In addition, in the phosphor having the aforementioned general composition formula $M_mA_aD_bO_oN_n:Z$, the element M is the element having bivalent valency, the element A is the element having tervalent valency, element D is the element having tetravalent valency, and nitrogen is the element having—tervalent valency. Therefore, when m, a, b, o, and n have the relation expressed by $n=2/3m+a+4/3b-2/3o$, the valency of each element is added to become zero, and preferably the phosphor becomes a chemically stable compound.

In the phosphor of this embodiment expressed by the general formula $M_mA_aD_bO_oN_n:Z$, the values of m, a, b, o, and n may be in the range of $5.0<(a+b)/m<9.0$, $0 \leq a/m \leq 2.0$, $0 \leq o<n$, $n=2/3m+a+4/3b-2/3o$, and further preferably $4.0 \leq b/m \leq 8.0$, $6.0 \leq (a+b)/m \leq 8.0$, and $0<o/m \leq 3.0$. This is because by setting optimal values of a and o in the aforementioned range in accordance with the values of m and b, generation of impurity phases can be significantly prevented, and deterioration in crystallinity due to vitrification can be prevented. This is because when $a/m$ is not more than 2.0, an orderly stable network can be established in terms of structure, by the element A, the element D, the oxygen, and AlN, which is a raw material, is not remained as an unreacted raw material, but can be substantially fully solved in a tetrahedral [SiN$_4$] or [(Al, Si)(O,N)$_4$] network. Further, by values of a, b, o, n set as $a=x \times m$, $b=(6-x) \times m$, $o=(1+x) \times m$, $n=(8-x) \times m$, the element M takes an ideal structure surrounded by the tetrahedral [SiN$_4$] or [(Al, Si)(O, N)$_4$]. This contributes to improving the emission efficiency as the phosphor and is preferable. Here, x is in a range satisfying $0 \leq x \leq 2$, and more preferably satisfying $0 \leq x \leq 1.0$.

Meanwhile, under the excitation of the monochromatic light with the wavelength range from 350 nm to 430 nm, when the maximum emission intensity in the wavelength range from 400 nm to 500 nm is defined as P$_{max}$, and the minimum emission intensity is defined as P$_{min}$, P$_{min}$/P$_{max}$ is preferably 30% or more. This is because when 30% or more of P$_{min}$/P$_{max}$ is maintained, it is possible to obtain the phosphor capable of emitting efficiently stably emitting the light with the prescribed wavelength, even if various excitation sources emitting light of ultraviolet or near ultraviolet with the wavelength range from 350 nm to 430 nm or the emission wavelength of the emission element is varied or fluctuated.

Meanwhile, preferably the element M is more than one kind of element selected from a group consisting of Mg, Ca, Sr, Ba, Zn, and rare earth elements having bivalent valency, more preferably is more than one kind of element selected from the group consisting of Mg, Ca, Sr, Ba, and Zn, and most preferably is Sr or Ba. In any case, preferably the element M contains Sr.

Preferably the element A is more than one kind of element selected from a group consisting of Al, Ga, In, Tl, Y, Sc, P, As, Sb, and Bi, more preferably is more than one kind of element selected from the group consisting of Al, Ga, and In, and most preferably is Al. In regards to Al, AlN, which is nitride, is used as a general thermoelectric material and structural material, and is easily available at a low cost with a small environmental load.

Preferably, the element D is more than one kind of element selected from the group consisting of Si, Ge, Sn, Ti, Hf, Mo, W, Cr, Pb, Zr, more preferably is Si and/or Ge, and most preferably is Si. In regards to Si, Si$_3$N$_4$, which is nitride, is used as a general thermoelectric material and structural material, and is easily available at a low cost with a small environmental load.

The element Z is more than one kind of element selected from the group consisting of the rare earth elements or transition metal elements, which is blended in the form of replacing a part of the element M in a matrix structure of the phosphor. From the viewpoint of exhibiting a sufficient color rendering properties by various light sources such as a white LED illumination using the phosphor of this embodiment, it is preferable that the half value width of the peak in the emission spectrum of this phosphor is broad. From this viewpoint, preferably the element Z is more than one kind of element selected from the group consisting of Eu, Ce, Pr, Tb, Yb, and Mn. Among these elements, when Eu is used as the element Z, the phosphor exhibits a blue and broad emission spectrum with high emission intensity. Therefore, Eu is preferable as the activator of each kind of light source such as the white LED illumination.

Preferably, an amount of the element Z to be added is in the range of not less than 0.0001 and not more than 0.50 in the molar ratio z/(m+z) of the element M to the element Z, which is the activator, when the phosphor according to the present invention is expressed by a general formula MmAaDbOoNn: Zz (satisfying $5.0<(a+b)/m<9.0$, $0 \leq a/m \leq 2.0$, $0 \leq o<n$, $n=2/3m+a+4/3b-2/3o$). When the molar ratio z/(m+z) of the element M to the element Z is in the above-described range, deterioration in the emission efficiency can be averted, which is caused by concentration quenching due to excessive content of the activator (element Z). Meanwhile, the deterioration in the emission efficiency can also be averted, which is caused by insufficient emission contributing element due to inadequate content of the activator (element Z). Further, more preferably, the value of the z/(m+z) is in the range of not less than 0.001 and not more than 0.30. However, an optimal value of the range of the value of the z/(m+z) is slightly fluctuated according to the kind of the activator (element Z) and the kind of the element M. Further, by controlling the amount of the activator (element Z) to be added also, the peak wavelength of the emission of the phosphor can be set to be shifted, and this is effective when adjusting the luminance and chromaticity in the light source to be obtained.

Also, by selecting the element Z, the peak wavelength of the light emission in the phosphor of this embodiment can be varied, and by activating with a different plurality of elements Z, the peak wavelength can be varied and further the emission intensity and luminance can be improved by a photosensitizing effect.

As a result of a composition analysis of the phosphor of the present invention, the phosphor contains Sr of 16.0 wt % to 25.0 wt %, Al of 2.0 wt % to 9.0 wt %, 0 of 0.5 wt % to 11.5 wt %, N of 23.0 wt % to 32.0 wt %, and Eu of 0 to 3.5 wt %. However, an analysis error of ±2.0 wt % is estimated in Sr and Al, and remaining weight is Si and other elements.

Note that from the viewpoint of obviating the deterioration of the emission intensity, the concentration of each element of Fe, Ni, and Co in the phosphor is preferably 100 ppm or less, and the concentration of B(boron) and C(carbon) is 0.1 wt % or less.

When the values of m, a, b, o, and n of each element calculated from a composition analysis result, and the values of m, a, b, o, and n calculated by the blending ratio of the raw materials to be used are compared, a slight deviation is generated. This is because a little amount of raw material is decomposed or evaporated during firing, and further is considered to be caused by an analysis error. Particularly, when o is calculated, the oxygen slightly contained is not taken into consideration, such as the oxygen initially contained in the raw material, the oxygen adhered to the surface, the oxygen mixed in by oxidization of the surface of the material when the raw material is weighed, mixed, and fired, and further the oxygen adsorbed on the surface of the phosphor after firing. When the raw materials are fired in an atmosphere containing the nitrogen gas and/or ammonia gas, the raw material is nitrided during firing and a slight deviation is generated in and n.

Next, a powder X-ray diffraction pattern shown by the phosphor of the present invention will be explained with reference to FIG. 2. FIG. 2 shows the powder X-ray diffraction pattern by CoKα ray of the phosphor according to examples 2, 4, 6, and a comparative example 2 as will be described as an example of the phosphor according to the present invention, wherein the Bragg angle (2θ) of a main peak and the intensity are compared. The diffraction pattern shown in the lowermost part is the diffraction pattern of Sr$_2$Al$_2$Si$_{10}$O$_4$N$_{14}$ described in the JCPDS card (53-0636), and a non-patent document J. Mater. Chem., 1999, 9 1019-1022.

As is clarified from the comparison with the diffraction peak obtained by this embodiment as shown in FIG. 2, an overall patter of a main diffraction peak of the phosphor thus obtained has a resemblance to the pattern of the diffraction peak of Sr$_2$Al$_2$Si$_{10}$O$_4$N$_{14}$ which is reported in JCPDS card. However, specifically, the peak of the phosphor of the present invention shifts in a direction of enlarging the Bragg angle (2θ), compared to a main peak of Sr$_2$Al$_2$Si$_{10}$O$_4$N$_{14}$ crystal reported in the JCPDS card. Therefore, although there is a resemblance between both patterns, it appears that they have different crystal structures with different crystal face interval. Here, the difference in oxygen amount present in both crystal structures, and the fact that a part of Sr is replaced with Eu in the phosphor of the present invention, can be considered as factors of giving aforementioned difference between crystal structures of both patterns. However, since the overall pattern of the main peak is similar to each other, it appears that the crystal of the product phase of the phosphor of the present invention has a crystal system of a hexagonal crystal system shown by space group Imm2 in the same way as the $Sr_2Al_2Si_{10}O_4N_{14}$ crystal reported in the JCPDS card.

As described above, although the phosphor of the present invention is similar to the $Sr_2Al_2Si_{10}O_4N_{14}$ crystal reported in the JCPDS card, it has a new crystal structure with different crystal face interval. Therefore, the structure of the phosphor of the present invention having such a new crystal structure is defined by the X-ray diffraction pattern shown by the phosphor, a length (lattice constant) of a crystal axis and a unit volume of the crystal lattice.

According to the phosphor obtained by this embodiment, in an X-ray diffraction pattern by a powder method using CoKα ray, a diffraction peak with highest intensity is shown in a Bragg angle (2θ) range from 35° to 37°, and further in the Bragg angle (2θ) range from 23.6° to 25.6°, 33° to 35°, 39.7° to 40.7°, and 43° to 44° of an X-ray diffraction pattern by the powder method, two, two, one, and one characteristic diffraction peaks are shown, respectively and when a relative intensity of the diffraction peak with highest intensity observed in the Bragg angle (2θ) range from 35° to 37° is defined as 100%, the relative intensity of the diffraction peaks is not less than 2.0%, and not more than 40%. By satisfying this characteristic, it is possible to obtain the phosphor having more excellent emission efficiency, when excited by the light in the wavelength range from 250 nm to 430 nm, having the emission spectrum with a maximum peak wavelength in a range from 400 nm to 500 nm.

In addition, in the X-ray diffraction pattern by the powder method, preferably there is no diffraction peak with 10% or more relative intensity in the Bragg angle (2θ) range from 26° to 33°, 38.7° to 39.7°, and 42.0° to 42.8°, when the relative intensity of the diffraction peak with highest intensity which is observed in the Bragg angle (2θ) range from 35° to 37° is defined as 100%. This is because the diffraction peak observed in the aforementioned range is caused by an impurity phase different from the phase having the emission spectrum with a peak in the wavelength range from 400 nm to 500 nm. Namely, when this impurity phase is insufficient, it is possible to prevent the deterioration of the emission efficiency caused by absorbing the excitation light or the light emitted from the phosphor by the generated impurity phase, thus making it possible to obtain high emission intensity.

Further, in the X-ray diffraction pattern by the powder method using CoKα ray, the diffraction peak with highest intensity in the Bragg angle (2θ) range from 35° to 37° is focused. Then, it is found that by containing Al in constituent elements, there are two peaks (see X-ray diffraction pattern of examples 2, 4, 6 and examples 13, 20, 45, 49, 52 in FIG. 2 and FIG. 8 as will be described later). Then, it was found that the phosphor having the X-ray diffraction pattern with two peaks (in the aforementioned range) by adding Al, is liable to have a more excellent emission characteristic.

Further, along with the measurement of the peak position of the XRD, the inventors of the present invention performed crystal structure analysis of a phosphor sample by using a Rietveld method based on the powder X-ray measurement result. The Rietveld method is a method of comparing a measurement diffraction intensity of the X-ray obtained from an actual measurement and a diffraction intensity of the X-ray obtained by calculation logically from a crystal structure model assembled by estimating this crystal structure, and making various structure parameters in the latter model more precise by a minimum square method to make the difference between the above-described both diffraction intensities, thereby introducing a model of more precise crystal structure. A program "RIETAN-2000" is used for the Rietveld analysis, and the crystal structure of $Sr_2Al_2Si_{10}O_4N_{14}$ reported in the JCPDS card 53-0636 is used as a reference crystal structure.

As a result of the crystal structure analysis by the Rietveld method, excellent tendency can be observed in the improvement of the emission characteristic of the phosphor sample, when the lattice constant of each crystal lattice of a-axis, b-axis, and c-axis of this phosphor sample is smaller than the crystal structure of the $Sr_2Al_2Si_{10}O_4N_{14}$ and also when the volume of the crystal lattice is smaller. Meanwhile, when compared with the $SrSi_6N_8$ crystal structure reported in a non-patent document Z. Anorg. Allg. Chem., 2004, 630, 1729, the excellent tendency can be observed when the crystal lattice of a-axis, b-axis, and c-axis of the phosphor sample is larger than the $SrSi_6N_8$ crystal structure and when the volume of the crystal lattice is larger. Although detailed reason for this phenomenon is not unclear, it appears that the Si atom and the Al atom contained in the phosphor sample are replaced with the nitrogen atom and the oxygen atom, thereby changing the crystal lattice and the volume.

Further, the inventors of the present invention reaches a viewpoint that since the crystal lattice and the volume of the crystal structure are related to Al and an amount of oxygen contained in the crystal structure, the emission characteristic such as emission efficiency of the phosphor is influenced by the Al and the amount of oxygen. Also, since the Al and the amount of oxygen defines the volume of the crystal lattice, the inventors of the present invention reaches the viewpoint that there is the volume of the crystal lattice capable of obtaining the phosphor having the excellent emission efficiency, and founds that the volume of this crystal phosphor is 345 Å$^3$ to 385 Å$^3$, further preferably the volume is 353 Å$^3$ to 385 Å$^3$. Further, since the Al or the amount of oxygen defines the lattice constant of the crystal lattice of the phosphor, the inventors of the present invention reach the point that there is the lattice constant of the crystal lattice capable of obtaining the phosphor having excellent emission efficiency, and founds that this lattice constant is defined so that "a" is 7.85 Å to 8.28 Å, "b" is 9.26 Å to 9.58, and "c" is 4.80 Å to 4.92 Å. (Note that in the present invention, the a-axis, b-axis, and c-axis are taken with reference to the JCPDS card. Accordingly, depending on how to take the axes, the order of the a-axis, b-axis, and c-axis may be replaced, without changing the meaning.)

Also, the inventors of the present invention reach the point that the crystal size of the phosphor has an influence on the emission characteristic such as emission efficiency of the phosphor.

Therefore, a half value width B of a plurality of diffraction peaks of the diffraction pattern obtained by the powder X-ray diffraction measurement is calculated for the phosphor sample of the present invention, and by using Sheller's formula $Dx=0.9\lambda/B \cos\theta$ (here, Dx is the size of the crystallite, λ is the wavelength of the X-ray used in measurement, B is the half value width of the diffraction peak, and θ is the Bragg angle of the diffraction peak), the size (Dx) of the crystallite is obtained by averaging three diffraction peaks, with 2θ in a range of 39.7° to 40.7°, 43° to 44°, 66° to 66.5°. Here, as the crystallite size becomes larger, crystallinity of the manufactured phosphor particle is excellent, and the improvement of the emission efficiency is expected. From this point of view, it is found by the inventors of the present invention that when the crystallite size is 20 nm or more, preferably 50 nm or more, and further preferably 80 nm or more, sufficient emission intensity can be obtained when this phosphor is used as the emission device.

When the phosphor of the present invention is used in a powdery state, it is preferable to set the average particle size of this phosphor at 50 μm or less. This is because it appears that emission mainly occurs on the surface of the particle in the phosphor powder, and therefore by setting the average particle size (note that in the present invention, the average particle size refers to a median diameter (D50).) at 50 μm or less, the surface area per unit weight of the powder can be secured, thus making it possible to prevent the deterioration of the luminance. Further, when the powder is formed into a paste and applied to a light emitting element, etc, density of this powder can be improved, and from this viewpoint also, the deterioration of the luminance can be prevented. In addition, according to an examination by the inventors of the present invention, although detailed reason is not clear, the average particle size is preferably set at 1.0 μm or more, from the viewpoint of the emission efficiency of the phosphor powder. As described above, the average particle size of the phosphor powder according to the present invention is preferably set at 1.0 μm to 50 μm, and further preferably set at 5.0 μm to 30 μm. The average particle size (D50) here is the value measured by LS230 (a laser diffraction and scattering method) by Beckman Coulter, Inc. In addition, from the above-described viewpoint, the specific surface area (BET) of the phosphor powder of the present invention is preferably set at 0.05 $m^2/g$ to 5.00 $m^2/g$.

The phosphor of this embodiment has the emission spectrum with a peak in the range from 400 nm to 500 nm with a broad peak shape, has an excellent emission intensity and luminance, and therefore is suitable for the white LED illuminating phosphor. Further, the phosphor of this embodiment has the emission spectrum with an excellent excitation band in the range of the near ultraviolet/ultraviolet, and therefore, it can be used in a condition which is closer to a maximum emission intensity, when used in the white LED illumination system in which white color is obtained by using a mixed state of the light obtained from the R, G, B and other phosphor, by combining the LED emitting the near ultraviolet/ultraviolet light (near the wavelength range from 380 to 410 nm) proposed as the one-chip type white LED illumination and the red (R) color emitting phosphor, the green (G) color emitting phosphor, and the blue (B) color emitting phosphor excited by the near ultraviolet/ultraviolet light generated from the LED. Specifically, by combining the light emitting part for emitting the near ultraviolet/ultraviolet light and the phosphor, a white color light source and the white LED illumination with high output and excellent color rendering properties, and further an illumination unit using the same can be obtained.

By combining the blue phosphor of this embodiment formed in a powdery state and the publicly-known green phosphor and the red phosphor, a phosphor mixture containing the phosphor of this embodiment is prepared, and by combining with the light emitting part for emitting light with the wavelength range from 250 nm to 450 nm, preferably the wavelength range from 350 nm to 430 nm, various kinds of illumination devices and mainly a backlight for a display apparatus can be manufactured.

As the green phosphor to be combined with, $SrAlSi_4N_7$:Ce, $Sr_2Al_2Si_{100}N_{14}$:Ce, $SrAl_{1+x}Si_{4-x}O_xN_{7-x}$:Ce($0 \leq x \leq 1$), (Ba, Sr, Ca)$Si_2O_2N_2$:Eu,ZnS:Cu, Al,ZnS:Cu, $SrAl_2O_4$:Eu, BAM:Eu, Mn, (Ba, Sr, Ca, Mg)$_2SiO_4$:Eu, $Sr_3SiO_5$:Eu are given as examples, however this is not limited thereto. Also, as the red phosphor to be combined with, $Y_2O_2S$:Eu, $La_2O_2S$:Eu, $3.5MgO\cdot 0.5MgF_2\cdot GeO_2$:Mn, (La, Mn, Sm)$_2O_2S\cdot Ga_2O_3$:Eu, SrS:Eu, CaS:Eu, $Sr_2Si_5N_8$:Eu, (Ca, Sr)$_2Si_5N_8$:Eu, (Ba, Sr, Ca)$_3MgSi_2O_8$:Eu, Mn, $CaAlSiN_3$:Eu are given as examples, however this is not limited thereto.

As the light emitting part, for example, the LED light emitting element for emitting light in the wavelength range from ultraviolet to near ultraviolet and a discharge lamp generating ultraviolet light can be used. When the phosphor mixture containing the phosphor of this embodiment is combined with the discharge lamp generating ultraviolet light, the LED light emitting element, the fluorescent lamps, the illumination unit, and the display device can be manufactured. Also, by combining the phosphor of the present invention with the LED light emitting element emitting light of the ultraviolet to near ultraviolet, the illumination unit and the display device can be manufactured. Further by combining the phosphor of the present invention with a device emitting electron beam, the display device can be manufactured.

A method of combining the phosphor mixture of this embodiment and the light emitting part may be performed by the publicly-known method. However, when the LED is used in the light emitting part of the light emission device, the light emission device can be manufactured as will be described below. The light emission device using the LED in the light emitting part will be explained hereunder, with reference to the drawings.

FIG. 15(A) to FIG. 15(C) are schematic sectional views of general type LED light emission devices, and FIG. 16(A) to FIG. 16(E) are schematic sectional views of reflective type LED light emission devices. Note that the same signs and numerals are assigned to the corresponding part in each drawing, and explanation is omitted in some cases.

First, by using FIG. 15(A), explanation will be given to an example of the light emission device in which the LED is used in the light emitting part, and the LED and the phosphor mixture are combined. In the general type LED light emission device, an LED light emitting element 2 is set in a cup case 5 provided on the point of a lead frame 3, and is molded by a translucent resin 4. In this embodiment, the cup case 5 is totally buried with the phosphor mixture and a mixture obtained by dispersing the phosphor mixture in a translucent resin such as silicon and epoxy. A dispersed material of light such as $SiO_2$ and $Al_2O_3$ may be preferably contained in the resin.

Next, by using FIG. 15(B), explanation will be given to an example of a different light emission device. In this embodiment, a mixture 1 is applied on the cup case 5 and the upper surface of the LED light emitting element 2.

Next, by using FIG. 15(C), explanation will be given to an example of a further different light emission device. In this embodiment, the phosphor mixture 1 is set on the upper part of the LED light emitting element 2.

As described above, in the general type LED light emission device explained by using FIG. 15(A) to FIG. 15(C), although a light releasing direction from the LED light emitting element 2 is directed upward, even when the light releasing direction is directed downward, the light emission device can be prepared by the same method. For example, the reflective type LED light emission device is provided, in which a reflecting surface and a reflecting board are formed in a light releasing direction of the LED light emitting element 2, and the light released from the light emitting element 2 is reflected by the reflecting surface and emitted outside. Therefore, by using FIG. 16(A) to FIG. 16(E), explanation will be given to the light emission device in which the reflective type LED light emission device and the phosphor mixture of this embodiment are combined.

First, by using FIG. 16(A), explanation will be given to an example of the light emission device in which the reflective type LED light emission device is used in the light emitting part, with the reflective type LED light emission device and the phosphor mixture of this embodiment combined. In the reflective type LED light emission device, the LED light emitting element 2 is set on the tip end of one lead frame 3, and the light is emitted from the LED light emitting element 2, directing downward, then reflected by a reflecting surface 8, which is then released from the upper part. In this embodiment, the mixture 1 is applied on the reflecting surface 8. Note that a recessed portion formed by the reflecting surface 8 is sometimes filled with a transparent mold material 9 for protecting the LED light emitting element 2.

Next, by using FIG. 16(B), explanation will be given to an example of a different light emission device. In this embodiment, the mixture 1 is set at a lower part of the LED light emitting element 2.

Next, by using FIG. 16(c), explanation will be given to an example of the different light emission device. In this embodiment, the recessed portion formed by the reflecting surface 8 is filled with the mixture 1.

Next, by using FIG. 16(D), explanation will be given to an example of the different light emission device. In this embodiment, the mixture 1 is applied on the upper part of the transparent mold material 9 for protecting the LED light emitting element 2.

Next, by using FIG. 16(E), explanation will be given to an example of the different light emission device. In this embodiment, the mixture 1 is applied on the surface of the LED light emitting element 2.

The general type LED light emission device and the reflective type LED light emission device may be used selectively depending on the application. However, the reflective type LED light emission device has an advantage that it can be made thin, a light emitting area can be made large, and use efficiency of the light can be improved.

When the light emission device thus explained is used as an illuminating light source with high color rendering properties, it is necessary to have the emission spectrum with excellent color rendering properties. Therefore, by using an evaluation method of JIS Z 8726, the color rendering properties of the light emission device incorporating the phosphor mixture containing the phosphor of this embodiment was evaluated. In the evaluation of the JIS Z 8726, when a general color rendering index value Ra of the light source is set at 80 or more, the light source is regarded as an excellent light emission device. Preferably, when a special color rendering index value R15, which is an index showing a skin color component of a Japanese woman, is set at 80 or more, the light source is regarded as the excellent light emission device. However, the aforementioned index may not be satisfied, depending on the application not requiring the color rendering properties and a different purpose.

Therefore, the light emission device was manufactured, by which the phosphor mixture containing the phosphor of this embodiment was irradiated with the light from the light emitting part which emits light with the wavelength range from 250 nm to 430 nm, to cause the phosphor mixture to emit light. Note that an ultraviolet LED for emitting light of 405 nm wavelength was used as the light emitting part. As a result, the color rendering properties of the light source incorporating the phosphor mixture containing the phosphor of this embodiment exhibited improved values such as Ra set at 80 or more, further preferably R15 set at 80 or more, and R9 set at 60 or more in the range of correlated color temperature from 10000K to 2000K (further preferably 7000K to 2500K), and it was found that the light emission device thus explained was regarded as an excellent light source with high luminance and significantly improved color rendering properties.

Meanwhile, a phosphor sheet may be formed by dispersing the phosphor mixture of the present invention in the resin. As a material, being a medium, used for manufacturing the phosphor sheet, each kind of resin such as epoxy resin and silicon resin, or glass, etc, can be taken into consideration. As a use example of this phosphor sheet, the phosphor sheet and a light source performing suitable emission are combined, and a specific emission can be performed. Note that the excitation light whereby the phosphor sheet is excited may be the light in the wavelength range from 250 nm to 430 nm, and an ultraviolet ray light source by Hg discharge and a light source by laser may be used.

Next, as a manufacturing method of the phosphor of this embodiment, explanation will be given to an example of a manufacture of $SrAl_xSi_{6-x}O_{1+x}N_{8-x}$:Eu (wherein x=0.8, Eu/(Sr+Eu)=0.030). Note that mixing composition of the raw materials and generated composition after firing are different from each other, because of an evaporation during firing of the phosphor raw materials. Particularly, in firing at 1700° C. or more and in firing for a long time, $Si_3N_4$ is gradually sublimated by firing. Therefore, a mixing molar ratio may preferably be set larger than a target molar ratio. However, a sublimation amount is changed depending on a condition during firing, and therefore the mixing amount is preferably adjusted by each firing condition. Therefore, as a matter of convenience, the composition formula calculated by the blending ratio of the phosphor raw materials is shown in the explanation hereunder. Accordingly, in this embodiment, the manufacturing method will be explained, with the phosphor expressed by the composition formula $SrAlSi_{6.5}O_{1.25}N_{9.50}$:Eu, during mixing of the raw materials. Here, z/(m+z) and Eu/(Sr+Eu) have the same meaning. Note that only slight amount of oxygen is contained in the raw materials of an activator element during mixing, and therefore such an oxygen amount is ignored.

Generally, a plurality of phosphors are manufactured by a solid phase reaction, and the manufacturing method of the phosphor of this embodiment can also be obtained by the solid phase reaction. However, the manufacturing method is not limited thereto. Each raw material of the element M, the element A, and the element D may be a commercially available material such as nitride, oxide, carbonate, hydroxide, basic carbonate. However, higher purity is preferable and the raw material with 2N or more, more preferably with 3N or more is therefore prepared. Preferably, the particle size of each particle of the raw materials is generally a fine particle from the viewpoint of accelerating reaction. However, the particle size and the shape of the phosphor obtained are changed according to the particle size and the shape of the raw material. Therefore, by adjusting to the particle size required for the phosphor finally obtained, the nitride raw material having the particle size approximating to that of the phosphor thus finally obtained may be prepared. The raw material having a particle size of 50 μm or less is preferably used, and the raw material having a particle size of 0.1 μm to 10.0 μm is further preferably used. As the raw material of the element Z also, the commercially available raw material such as nitride, oxide, carbonate, hydroxide, basic carbonate, or simple substance metal is preferable. Of course, higher purity is preferable, and therefore the raw material preferably with the purity of 2N or more, more preferably with the purity of 3N or more is prepared. Particularly, when the carbonate is used as the raw material of the element M, an effect of flux can be preferably obtained, without adding the compound composed of the element not contained in the constituent element of the phosphor of this embodiment as the flux (reaction promoter).

In manufacturing the phosphor with composition formula of $SrAl_{0.8}Si_{5.2}O_{1.8}N_{7.2}$:Eu, a decrease amount of the raw material during firing is adjusted and a mixing composition formula may be determined, so that the molar ratio of each element after firing is Sr:Al:Si:O:Eu=0.970:0.8:5.2:1.8:0.030. When manufacturing $SrAlSi_{6.5}O_{1.25}N_{9.50}$:Eu (wherein Eu/(Sr+Eu)=0.030), $SrCO_3$(3N), $Al_2O_3$(3N), AlN (3N), $Si_3N_4$(3N) may be prepared as the raw materials of the element M, the element A, and the element D, and $Eu_2O_3$(3N) may be prepared as the element Z. The raw materials thus prepared are weighed and mixed so as to obtain the mixing ratio of each raw material set at 0.970 mol of $SrCO_3$, 0.25/3 mol of $Al_2O_3$, (1.0−0.25/3×2) mol of AlN, 6.5/3 mol of $Si_3N_4$, and 0.030/2 mol of $Eu_2O_3$ respectively. The carbonate is used as the Sr raw material. This is because an oxide raw material has a high melting point, and therefore the effect of the flux can not be expected, meanwhile, when the raw material having a low melting point such as carbonate is used, the raw material itself acts as the flux, thereby promoting the reaction and improving the emission characteristic. In addition, a slight amount of C (carbon) may be added to the raw material to improve reducibility during firing. However, when a large amount of C concentration is left after firing, the deterioration of the emission characteristic is thereby caused. Therefore, the concentration of C contained in the sample after firing needs to be adjusted so as to be 0.1 wt % or less. In addition, when the oxide is used as the raw material, another substance may be added as the flux, to obtain the effect of the flux. However, in this case, it should be noted that the flux becomes the impurity, thereby posing the possibility of deteriorating the characteristic of the phosphor.

The weighing and mixing may be performed in an atmospheric air, however the nitride of each raw material element is easily influenced by humidity, and therefore the inert gas from which the humidity is sufficiently removed is preferably used, to operate in a glove box. A mixing system may be either way of a wet type or a dry type. However, when pure water is used as the solvent of the wet type mixing, the raw material is decomposed, and therefore proper organic solvent or liquid nitrogen needs to be selected. As a device, a usual device such as a ball mill or a mortar may be used. Note that this flux effect will be explained in an example.

The raw materials thus mixed are put in a crucible, retained and fired at 1600° C. or more, more preferably at 1700° C. to 2000° C., for 30 minutes or more, while flowing atmosphere gas into the firing furnace. When the firing temperature is set at 1600° C. or more, the solid reaction progresses preferably and the phosphor having the excellent emission characteristic can be obtained. In addition, when the raw materials are fired at 2000° C. or less, excessive sintering and melting can be prevented from occurring. Note that the higher the firing temperature is, the more rapidly the firing is advanced, and the retaining time can therefore be shortened. Meanwhile, even when the firing temperature is low, the target emission characteristics can be obtained by maintaining the temperature for a long time. However, the longer the firing time is, the more rapidly particle growth is advanced, and the particle size becomes large. Therefore, the firing time may be set in accordance with the target particle size.

An atmosphere gas flown into the firing furnace is not limited to nitrogen, and any one of the gases of inert gas such as rare gas, ammonia, mixed gas of the ammonia and nitrogen, or mixed gas of the nitrogen and hydrogen may be used. However, when the oxygen is contained in the atmosphere gas, oxidizing reaction of the phosphor particle occurs. Therefore, the oxygen contained as the impurity is reduced as much as possible, and is preferably reduced to 1000 ppm or less. Further, when the humidity is contained in the atmosphere gas, in the same way as the oxygen, the oxidizing reaction of the phosphor particle occurs during firing. Therefore, the humidity contained as the impurity is reduced as much as possible, and is preferably reduced to 1000 ppm or less, for example. Here, when a single gas is used as the atmosphere gas, nitrogen gas is preferable. Although firing by independent use of the ammonia gas is possible, the ammonia gas is more expensive than the nitrogen gas in terms of cost and is corrosive gas. Therefore, a special treatment is needed in a device and an exhaustion-method at a low temperature. Accordingly, when the ammonia is used, preferably the ammonia is set in a low concentration such as being mixed with nitrogen. For example, when the mixed gas of the nitrogen gas and the ammonia is used, 80% or more of the nitrogen and 20% or less of the ammonia are preferably used. Also, when the mixed gas of the nitrogen and other gas is used, by an increase of gas concentration other than the nitrogen, a partial pressure of the nitrogen in the atmosphere gas is decreased. Therefore, from the viewpoint of accelerating a nitride reaction of the phosphor, an inactive or a reductive gas containing 80% or more of nitrogen may be preferably used.

In addition, preferably firing is performed with the aforementioned gas atmosphere being kept flowing in the furnace at a flow rate of 0.1 ml/min or more. This is because although gas is generated from the raw material during firing, by flowing the atmosphere containing one or more kind of gas selected from the aforementioned inert gas such as nitrogen and rare gas, ammonia, mixed gas of the ammonia and the nitrogen, or the mixed gas of the nitrogen and hydrogen, the furnace can be prevented from being filled with the gas generated from the raw materials, resulting in having an influence on the reaction, and consequently the deterioration in the emission characteristic of the phosphor can be prevented. Particularly, when the raw material which is decomposed into oxides at high temperature, such as carbonate, hydroxide, and basic carbonate is used, a large amount of gas is generated. Therefore, preferably by flowing the gas in a firing furnace, generated gas is exhausted.

Meanwhile, in a step of firing the phosphor raw material in manufacturing the phosphor, the pressure in the firing furnace is preferably set in a pressurized state so as not allow the oxygen in the atmospheric air to be mixed into the furnace. However, when this pressure exceeds 11.0 MPa (in the present invention, an in-furnace pressure means a pressurized amount from the atmospheric air), a special pressure-resistant design is required in designing a furnace facility. Therefore, the pressurized amount is preferably 11.0 MPa or less in consideration of productivity. Also, when the pressurized amount is increased, sintering between phosphor particles is excessively advanced, thus making it difficult to pulverize after firing. Therefore, the in-furnace pressure during firing is preferably set at 11.0 MPa or less, and further preferably set at 0.001 MPa to 0.1 MPa.

The crucible may be used, such as an $Al_2O_3$ crucible, a $Si_3N_4$ crucible, an AlN crucible, a sialon crucible, a C (carbon) crucible, and a BN (boron nitride) crucible, which can be used in the aforementioned gas atmosphere. However, above all, the crucible composed of nitride is preferable, and when the BN crucible is used, intrusion of impurities from the crucible can be averted and this is preferable. When 0.1 wt % or less of B(boron) and/or C is contained as an amount of impurities after firing, the emission characteristic is not inhibited and this is preferable.

After completing the firing, a fired matter is taken out from the crucible. Then, by using a pulverizing means such as the mortar and the ball mill or the like, the fired matter is pulverized to obtain a prescribed average particle size, and the phosphor expressed by the composition formula $SrAl_{0.8}Si_{5.2}O_{1.8}N_{7.2}$:Eu can be manufactured. The phosphor thus obtained is subjected to cleaning, classifying, surface treatment, and heat treatment as needed. As a method of cleaning, cleaning in an acid solution using fluorinated acid, hydrochloric acid, sulfuric acid, and nitric acid is preferable, because metal atom such as Fe adhered to the surface of the particle and a raw material particle which is unreacted and remained can be resolved. Here, amounts of Fe, Ni, and Co contained in the phosphor thus obtained are preferably 1000 ppm or less.

When other element is used as the element M, the element A, the element D, and the element Z, and when an amount of Eu to be activated, which is an activator, is changed, the phosphor can be manufactured by the same manufacturing method as that described above, by adjusting the blending amount of each raw material during mixing to a predetermined composition ratio. However, depending on a firing condition, evaporation or sublimation of raw materials occurs during firing, and therefore mixing/firing of the raw materials is performed in consideration of the mixing composition of the raw materials by an amount of such evaporation/sublimation.

EXAMPLE

The present invention will be more specifically explained, based on examples. (examples 1 to 6, and comparative examples 1 and 2)

The examples 1 to 6 were manufactured in such a manner that the molar ratio of Sr, Al, and O was fixed to 1, 1, 1, respectively and the b/m ratio thereof was changed in the phosphor having the mixing composition formula of the raw materials of the present invention expressed by $SrAlSi_bON_n$:Eu(Eu/(Sr+Eu)=0.030, n=2/3m+a+4/3b−2/3o, m=1, a=1, o=1), and the emission characteristics and the structure of this phosphor were examined.

First, the example 1 was manufactured by the following procedure. $SrCO_3$(3N), AlN(3N), $Si_3N_4$(3N), and $Eu_2O_3$ (3N) were prepared, and each raw material was weighed to obtain 0.970 mol of $SrCO_3$, 1 mol of AlN, 4/3 mol of $Si_3N_4$, and 0.030/2 mol of $Eu_2O_3$, so that the molar ratio of each element is Sr:Al:Si:Eu=0.970:1:4:0.030, which was then mixed by using the mortar in the atmospheric air. Since $SrCO_3$ is decomposed to become SrO during firing, and therefore the amount of oxygen was calculated as SrO. The raw materials thus mixed were put in the BN crucible, and after vacuously exhausting the inside of the furnace once, temperature was increased at 15° C./min up to 1800° C. with the pressure in the furnace set at 0.05 MPa in the flowing nitrogen atmosphere (flow state at 20.0 L/min), and the raw materials were retained/fired at 1800° C. for 3 hours, then, the temperature was decreased from 1800° C. to 50° C. to cool the raw materials for 90 minutes. Thereafter, a fired sample was pulverized by using the mortar up to a proper particle size in the atmospheric air, to thereby obtain the phosphor sample according to the example 1 satisfying b/m=4.0. Note that the composition formula thus obtained is calculated from the blending ratio of the raw materials used. Accordingly, the sublimation of Si and the reduction of oxygen occur during firing. Therefore, in a phosphor product after firing, the composition of less amount of Si or oxygen than the blending ratio of the raw materials (mixing composition ratio) can be considered.

Next, the phosphor sample according to examples 2 to 6 was manufactured, in the same way as the example 1 other than the point that the b/m ratio is adjusted to be b/m=5 (example 2), b/m=6 (example 3), b/m=7 (example 4), b/m=8 (example 5), b/m=8 (example 5), b/m=9 (example 6).

Also, the phosphor sample according to comparative examples 1 and 2 was manufactured in the same way as the example 1, other than the point that the b/m ratio is adjusted to be b/m=2 (comparative example 1) and b/m=3 (comparative example 2).

Regarding the manufactured samples of examples 1 to 6, and comparative examples 1 and 2, the emission peak wavelength and the emission intensity were measured. The measurement result is shown in table 1 and FIG. 1.

Here, in the examples 1 to 6, and the comparative examples 1 and 2, the emission peak wavelength refers to the wavelength shown by a maximum peak value of the spectrum of the light released by the phosphor, when the phosphor is irradiated with the light of some wavelength or energy, and the emission intensity refers to an intensity in the peak wavelength of this emission. Note that the emission spectrum and an excitation spectrum as will be described later were measured by using a spectrofluorometer FP-6500 by JASCO Corporation.

In the examples 1 to 6, and the comparative examples 1 and 2, the phosphor was irradiated with the light with the wavelength of 405 nm as the excitation light. Then, the emission intensity of each example was shown, with a value of the emission intensity in the peak wavelength of b/m=7 (example 4) standardized as 100%.

FIG. 1 is a graph showing the relative intensity of the emission intensity of the phosphor sample taken on the ordinate axis, and showing the value of the b/m ratio taken on the abscissa axis.

Next, the X-ray diffraction pattern by a powder method was measured, for the samples of the examples 2, 4, 6, and the comparative example 2. Further, a Rietveld analysis was performed to the sample of the example 4. The result is shown in FIG. 2. In FIG. 2, the X-ray diffraction pattern is shown in an order of comparative example 2, examples 2, 4, 6, a Rietveld analysis result and the diffraction pattern of the JCPDS card (53-0636) from upside.

As is clarified from the result of table 1 and FIG. 1, the emission intensity of the phosphor according to the examples 1 to 6 is increased, as the value of the b/m ratio becomes larger, showing strongest emission intensity in the vicinity of b/m=6 to b/m=7.

In addition, the sample with the value of the b/m ratio set at 3 or less according to the comparative examples 1 and 2 was an orange phosphor having the emission spectrum with a peak in the vicinity of the wavelength of 630 nm, not having the peak of the emission spectrum in the wavelength range from 400 nm to 500 nm.

TABLE 1

| | b/m | MIXING AMOUNT OF LAW MATERIALS/mol | | | | PEAK WAVELENGTH (nm) | EMISSION INTENSITY (%) | LATTICE CONSTANT | | | LATTICE VOLUME | |
|---|---|---|---|---|---|---|---|---|---|---|---|---|
| | | $SrCO_3$ | AlN | $Si_3N_4$ | $Eu_2O_3$ | | | a (Å) | b (Å) | c (Å) | V (Å$^3$) | Dx (nm) |
| EXAMPLE 1 | 4.0 | 0.970 | 1.000 | 1.333 | 0.015 | 445.8 | 13.9 | — | — | — | — | — |
| EXAMPLE 2 | 5.0 | 0.970 | 1.000 | 1.667 | 0.015 | 447.4 | 32.6 | — | — | — | — | — |
| EXAMPLE 3 | 6.0 | 0.970 | 1.000 | 2.000 | 0.015 | 451.1 | 89.6 | 7.901 | 9.288 | 4.841 | 355.2 | 69.2 |
| EXAMPLE 4 | 7.0 | 0.970 | 1.000 | 2.333 | 0.015 | 459.9 | 100.0 | 7.902 | 9.278 | 4.838 | 354.7 | 74.8 |
| EXAMPLE 5 | 8.0 | 0.970 | 1.000 | 2.667 | 0.015 | 459.9 | 68.1 | 7.902 | 9.279 | 4.832 | 354.3 | 73.1 |
| EXAMPLE 6 | 9.0 | 0.970 | 1.000 | 3.000 | 0.015 | 456.1 | 55.3 | 7.899 | 9.283 | 4.834 | 354.4 | 74.3 |
| COMPARATIVE EXAMPLE 1 | 2.0 | 0.970 | 1.000 | 0.667 | 0.015 | 642.6 | 59.7 | — | — | — | — | — |
| COMPARATIVE EXAMPLE 2 | 3.0 | 0.970 | 1.000 | 1.000 | 0.015 | 633.3 | 60.7 | — | — | — | — | — |
| $SrSi_6N_8(O)$ | — | — | — | — | — | — | — | 7.855 | 9.260 | 4.801 | 349.2 | — |
| JCPDS 53-0636 | — | — | — | — | — | — | — | 8.279 | 9.576 | 4.916 | 389.7 | — |

Here, a measurement method of the X-ray diffraction pattern of FIG. 2 by the powder method will be explained.

The phosphor to be measured was pulverized up to a predetermined (preferably from 1.0 μm to 50.0 μm) average particle size by using pulverizing means such as the mortar and the ball mill after firing. Then, a titanium holder was filled with the phosphor thus pulverized to form a flat surface, and the X-ray diffraction pattern was measured by an XRD apparatus by RIGAKU DENNKI INC., "RINT 2000". The measurement result is shown below.

X-ray bulb: CoKα
Tube voltage: 40 kV
Tube current: 30 mA
Scan method: 2θ/θ
Scan speed: 0.3°/min
Sampling interval: 0.01°
Start angle (2θ): 10°
Stop angle (2θ): 90°

It appears that the deviation of the Bragg angle (2θ) is caused by a not flat sample surface to be irradiated with X-ray, a measurement condition of the X-ray, and particularly by the difference in scan speed or the like. Therefore, a slight deviation is considered to be allowable in the range where a characteristic diffraction peak is observed. In order to suppress such a deviation as much as possible, the scan speed is set at 0.3°/min and then Si is mixed in the phosphor sample, and the deviation of the Si peak is corrected after X-ray measurement, to thereby obtain the Bragg angle (2θ) and a surface interval d(Å). Hereunder, the same measurement was performed for the sample of examples 13, 20, 45, 49, 52, and the samples of an example 45 and the comparative example 3 as shown in FIG. 13.

As is clearly shown from the result of the X-ray diffraction pattern by the powder method of FIG. 2, the X-ray diffraction pattern of example 4 showing strong emission intensity and the X-ray diffraction pattern of the comparative example 2 not having the emission peak in the wavelength range from 400 nm to 500 nm, and the X-ray diffraction pattern of the examples 2 and 6 having smaller emission peak than the emission peak of the example 4 are compared. Then, in the comparative example 2 and the examples 2 and 6, many diffraction peaks can be confirmed in the Bragg angle (2θ) in which no diffraction peak is observed in the example 4. Particularly, the diffraction peaks can be confirmed in the Bragg angle (2θ) range from 26° to 33°, 38.7° to 42.8°. Further, in the diffraction pattern of the comparative example 2, although the diffraction pattern similar to the example 4 can be observed, its generation ratio is about 40% of an entire phosphor product phase, and it is found that other many product phases considered to be yellow phosphors are contained. Namely, it appears that the diffraction peak in the Bragg angle (2θ) range from 26° to 33°, 38.7° to 42.8° is caused by a different phase (impurity phase) from the phase showing the peak of the emission spectrum in the wavelength range from 400 nm to 500 nm. Therefore, in order to obtain the phosphor having the peak of the emission spectrum in the wavelength range from 400 nm to 500 nm and strong emission intensity, Preferably, 50% or more of the above-described product phases (the phases similar to $SrAl_xSi_{6-x}O_{1+x}N_{8-x}$) are contained and the phosphor does not have the diffraction peak shown by these impurity phases.

Further, FIG. 2 shows the diffraction pattern simulated based on the crystal structure of $Sr_2Al_2Si_{10}O_4N_{14}$ reported in the JCPDS card (53-0636), and a simulation result obtained by subjecting the X-ray diffraction pattern of the example 4 to Rietbeld analysis based on the crystal structure of the $Sr_2Al_2Si_{10}O_4N_{14}$. By a Rietbeld method, an actually measured diffraction intensity obtained by an actual measurement, and a diffraction intensity obtained theoretically by calculation from a crystal structure model assembled by estimating the crystal structure are compared, and various structure parameters in the latter model is precisely obtained by a minimum square method so as to make small a difference between both diffraction intensities, thereby leading to a more precise crystal structure.

The crystal structure of $Sr_2Al_2Si_{10}O_4N_{14}$ reported in the JCPDS card (53-0636) is orthorhombic shown by a space group Imm2, and a lattice constant is reported to be a=8.279 Å, b=9.576 Å, c=4.916 Å. However, according to the analysis result of the example 4, although the crystal structure is similarly orthorhombic, the lattice constant is a=7.902 Å, b=9.278 Å, c=4.838 Å, showing the result that the crystal unit lattice is significantly smaller than that conventionally reported. The same result was obtained in all of the examples 3, 5, 6. The reason why the lattice constant is smaller than the value of the JCPDS card in the examples 4 to 6 is considered to be a contraction of the lattice, because in the phosphor product phase expressed by the composition formula of $SrAl_xSi_{6-x}O_{1+x}N_{8-x}$, the value of x takes a composition of 1 or less, or even if satisfying x=1, the value of x takes the composition with oxygen atom defective.

Meanwhile, the $SrSi_6N_8$ crystal structure reported in the non-patent document Z. Anorg. Allg. Chem., 2004, 630, 1729 has a orthorhombic crystal structure similar to the $Sr_2Al_2Si_{10}O_4N_{14}$ crystal reported in the JCPDS card. However, by small amounts of Al atom and oxygen atom, it is reported that the lattice constant is a=7.855 Å, b=9.260 Å, and c=4.801 Å, showing further smaller lattice constant than the phosphor obtained by this example.

As described above, it is found by the inventors of the present invention that although the phosphor of the present invention has a similar crystal structure as that of the $Sr_2Al_2Si_{10}O_4N_{14}$ reported in the JCPDS card and the $SrSi_6N_8$ reported in the Z. Anorg. Allg. Chem., 2004, 630, 1729, this phosphor is a new phosphor having a new crystal structure of different crystal face interval and having the composition formula expressed by $SrAl_xSi_{6-x}O_{1+x}N_{8-x}$, by changing an existence amount of the Al or oxygen atom. Therefore, in order to obtain the phosphor having excellent emission efficiency, the volume of the crystal lattice must be between the crystal structure of $Sr_2Al_2Si_{10}O_4N_{14}$ and the crystal structure of $SrSi_6N_8$, namely, a crystal volume must be 345 Å$^3$ or more and 385 Å$^3$ or less. Further preferably, the lattice constant of each crystal lattice must be set, so that a=7.85 Å to 8.2 Å, b=9.26 Å to 9.58 Å, and c=4.80 Å to 4.92 Å. In addition, x is preferably in a range of $0 \leqq x \leqq 2$, and is preferably $0 \leqq x \leqq 1.0$ with smaller lattice constant and unit constant.

In addition, in order to obtain the phosphor with the strong emission intensity, from the analysis result, it is found that preferably the diffraction pattern is close to the diffraction pattern obtained from the analysis result, and no diffraction peak of the impurity phase exists, which is observed in the Bragg angle range from 26° to 33°, 38.7° to 39.7°, and 42.0° to 42.8°. This is because in the mixing step and firing condition of the raw materials, when $Si_3N_4$ or AlN raw materials exists more excessively than a target composition, although slightly, such raw materials become the impurity phases and appear as the diffraction peak. Accordingly, by adjusting the mixing ratio of the raw materials adapted to each firing condition, these impurity phases can be reduced. Preferably, the aforementioned impurity peak is 10.0% or less, when the relative intensity of the diffraction peak with strongest intensity observed in a range of 35° to 37° is set at 100%.

Namely, in the sample of the present invention, the strongest emission intensity is shown in the vicinity of b/m=6 to b/m=7. This is because when the b/m ratio is in the vicinity of b/m=6, b/m=7, the sample containing 50% or more of the phases expressed by the composition formula $SrAl_xSi_{6-x}O_{1+x}N_{8-x}$ showing the peak of the emission spectrum in the wavelength range from 400 nm to 500 nm can be generated, thus making it possible to prevent the impurity phase from generating due to large deviation of the b/m ratio from b/m=6, b/m=7. Actually, when the sample after firing is observed, an entire color of the sample of b/m=6, b/m=7 is almost white. However, yellow or orange color impurity phase can be confirmed in other sample. (When the sample is irradiated with the light of 405 nm as the excitation light, a white part emits blue light, and yellow and orange parts emit yellow and orange lights.) However, it must be noted that, as is understandable from the composition formula of $SrAl_xSi_{6-x}O_{1+x}N_{8-x}$, the value of the b/m ratio is not always appropriately in the vicinity of b/m=6 to b/m=7, and when the a/m ratio is changed, an appropriate value of the b/m ratio is also slightly changed. This is because this phosphor basically has a network-assembled structure, and the site of a part of Si is replaced with Al. Therefore, when a replacement amount of Si by Al is changed, preferably an amount of Si is also changed to have a suitable structure for emission. Specifically, based on the above-described structure, the amount of Si is changed correspondingly to the replacement amount of the changed Al, to have a suitable structure for emission.

In addition, there is a difference in the ratio of Si, between the composition of the phosphor product phase estimated form the analysis result and the mixing composition of the raw materials. This is because, as described above, $Si_3N_4$ as a raw material is evaporated or decomposed from the point in the vicinity of 1700° C., and therefore the amount of Si is reduced during firing and the composition ratio is deviated. Here, depending on the firing temperature, firing time, and firing pressure during firing, a reducing amount of Si or other element is different, and therefore in order to obtain a target product, it is preferable to adjust the mixing amount of the raw materials suitable for each firing condition in advance.

Examples 7 to 15, and examples 16 to 24

In the examples 7 to 24, the mixing composition of Si and the amount of oxygen during weighing/mixing of the raw materials are changed, and the mixing composition and a target composition for obtaining the phosphor having the strong emission intensity were examined.

First, in the examples 7 to 15, the emission intensity of the samples of b/m=7 (example 4) showing the most excellent emission intensity in the examples 1 to 6 was examined, with the o/m ratio changed this time.

The examples 7 to 15 were manufactured in the following procedure.

Commercially available $Sr_3N_2$(2N), $SrCO_3$(3N), $Al_2O_3$(3N), AlN(3N), $Si_3N_4$(3N), and $Eu_2O_3$(3N) were prepared as the raw materials, and in the phosphor expressed by the mixing composition formula of the raw materials expressed by $SrAlSi_{7.0}O_0N_n$:Eu(Eu/(Sr+Eu)=0.030, n=2/3m+a+4/3b−2/3o, m=1, a=1, b=7), in the same way as the example 1, the phosphor sample was manufactured excepting that the molar ratio of Sr, Al, and Si was fixed to 1, 1, 7, respectively and the o/m ratio was set at o/m=0 (example 7). Similarly, each sample of o/m=0.50 (example 8), o/m=0.75 (example 9), o/m=1.00 (example 10), o/m=1.25 (example 11), o/m=1.50 (example 12), o/m=1.75 (example 13), o/m=2.00 (example 14), and o/m=2.50 (example 15) was manufactured.

The peak wavelength and the emission intensity were measured for the manufactured samples of the examples 7 to 15. This measurement result is shown in table 2 and FIG. 3. Here, in FIG. 3, the relative intensity of the emission intensity of the phosphor sample is taken on the ordinate axis, and the o/m ratio is taken on the abscissa axis. Note that regarding the emission intensity, the value of the emission intensity in the peak wavelength of o/m=1.75 (example 13) was standardized as 100%. Also, the light with the wavelength of 405 nm was used as the excitation light.

As is clarified from the result of the table 2 and FIG. 3, the emission intensity of each phosphor becomes stronger as the value of the o/m ratio becomes larger, and the strongest emission intensity was exhibited in the vicinity of o/m=1.75.

As described above, the emission intensity was examined when the o/m ratio was changed in the sample of b/m=7 (example 4) which exhibits the most excellent emission intensity among the examples 1 to 6, and the result of the examination is shown in the examples 7 to 15. Then, it was found that the phosphor showing the excellent emission intensity could be obtained by optimizing not only the b/m ratio but also the o/m ratio. In the examples 1 to 6, the most excellent emission intensity was exhibited in the sample of b/m=7, and o/m=1. However, it was found that the emission intensity was further improved by about 20%, by setting the b/m ratio and the o/m ratio at b/m=7 and o/m=1.75, respectively in the examples 7 to 15. The reason is considered in such a way that although deformation of the crystal structure occurs in association with the collapse of the balance of the electric charge by replacing a part of the Si site with Al having + tervalent valency and larger ion radius than that of Si having + tetravalent valency, in order to alleviate such a diformation, a part of N site having − tervalent valency is replaced with O having − bivalent valency and smaller ion radius than that of N, thereby maintaining the balance of the electric charge and making it possible to obtain the crystal structure suitable for the light emission. Accordingly, it appears that the optimal amount of O is changed depending on the ratio of Al and Si.

As is clarified from the result of the table 3 and FIG. 4, the emission intensity of each phosphor becomes stronger as the value of the o/m ratio becomes larger, and the strongest emission intensity was exhibited in the vicinity of o/m=1.00 to o/m=1.75.

Specifically, in the examples 16 to 24, the b/m ratio in the composition formula of the examples 7 to 15 is changed from

TABLE 2

| | | MIXING AMOUNT OF LAW MATERIALS/mol | | | | | | PEAK WAVELENGTH | EMISSION INTENSITY |
|---|---|---|---|---|---|---|---|---|---|
| | o/m | $Sr_3N_2$ | $SrCO_3$ | AlN | $Al_2O_3$ | $Si_3N_4$ | $Eu_2O_3$ | (nm) | (%) |
| EXAMPLE 7 | 0.000 | 0.323 | — | 1.000 | — | 2.333 | 0.015 | 460.9 | 11.9 |
| EXAMPLE 8 | 0.500 | 0.157 | 0.500 | 1.000 | — | 2.333 | 0.015 | 459.9 | 44.9 |
| EXAMPLE 9 | 0.750 | 0.073 | 0.750 | 1.000 | — | 2.333 | 0.015 | 458.2 | 58.4 |
| EXAMPLE 10 | 1.000 | — | 0.970 | 1.000 | — | 2.333 | 0.015 | 459.9 | 63.1 |
| EXAMPLE 11 | 1.250 | — | 0.970 | 0.833 | 0.083 | 2.333 | 0.015 | 456.0 | 77.4 |
| EXAMPLE 12 | 1.500 | — | 0.970 | 0.667 | 0.167 | 2.333 | 0.015 | 453.0 | 90.5 |
| EXAMPLE 13 | 1.750 | — | 0.970 | 0.500 | 0.250 | 2.333 | 0.015 | 451.4 | 100.0 |
| EXAMPLE 14 | 2.000 | — | 0.970 | 0.333 | 0.333 | 2.333 | 0.015 | 449.1 | 94.3 |
| EXAMPLE 15 | 2.500 | — | 0.970 | 0.000 | 0.500 | 2.333 | 0.015 | 451.4 | 19.7 |

Next, in the examples 16 to 24, examination is performed by changing the b/m=7 set in the aforementioned examples 7 to 15 to b/m=6.5.

First, the examples 16 to 24 were manufactured by the following procedure.

In the phosphor expressed by the mixing composition formula of the raw materials expressed by $SrAlSi_{6.5}O_oN_n$:Eu (Eu/(Sr+Eu)=0.030, n=2/3m+a+4/3b−2/3o, m=1, a=1, b=6.5), in the same way as the example 1, the phosphor sample was manufactured excepting that the molar ratio of Sr, Al, and Si was fixed to 1, 1, 6.5, respectively and the o/m ratio was set at o/m=0 (example 16). Similarly, each sample of b/m=7 to b/m=6.5. Then, it is found from the result of the table 3 and FIG. 4, that when the b/m ratio is changed an optimal o/m ratio is also changed. It appears that, as described in the examples 7 to 15, the balance of Al, Si, O, and N in the structure based on a constitutional formula of $SrAl_xSi_{6-x}O_{1+x}N_{8-x}$ is important. Also, there is a possibility that a melting point of the sample is lowered by an increase of the oxygen concentration during the mixing composition, and this contributes to an acceleration of the solid phase reaction and the improvement of crystallinity. Therefore, the firing temperature can be decreased during firing and the firing time can be shortened.

TABLE 3

| | | MIXING AMOUNT OF LAW MATERIALS/mol | | | | | | PEAK WAVELENGTH | EMISSION INTENSITY |
|---|---|---|---|---|---|---|---|---|---|
| | o/m | $Sr_3N_2$ | $SrCO_3$ | AlN | $Al_2O_3$ | $Si_3N_4$ | $Eu_2O_3$ | (nm) | (%) |
| EXAMPLE 16 | 0.000 | 0.323 | — | 1.000 | — | 2.167 | 0.015 | 460.9 | 12.5 |
| EXAMPLE 17 | 0.500 | 0.157 | 0.500 | 1.000 | — | 2.167 | 0.015 | 459.9 | 53.8 |
| EXAMPLE 18 | 0.750 | 0.073 | 0.750 | 1.000 | — | 2.167 | 0.015 | 455.9 | 78.0 |
| EXAMPLE 19 | 1.000 | — | 0.970 | 1.000 | — | 2.167 | 0.015 | 455.5 | 95.5 |
| EXAMPLE 20 | 1.250 | — | 0.970 | 0.833 | 0.083 | 2.167 | 0.015 | 455.5 | 100.0 |
| EXAMPLE 21 | 1.500 | — | 0.970 | 0.667 | 0.167 | 2.167 | 0.015 | 450.3 | 99.4 |
| EXAMPLE 22 | 1.750 | — | 0.970 | 0.500 | 0.250 | 2.167 | 0.015 | 448.6 | 94.3 |
| EXAMPLE 23 | 2.000 | — | 0.970 | 0.333 | 0.333 | 2.167 | 0.015 | 447.5 | 59.7 |
| EXAMPLE 24 | 2.500 | — | 0.970 | 0.000 | 0.500 | 2.167 | 0.015 | 449.7 | 16.2 | o/m=0.50 (example 17), o/m=0.75 (example 18), o/m=1.00 (example 19), o/m=1.25 (example 20), o/m=1.50 (example 21), o/m=1.75 (example 22), o/m=2.00 (example 23), and o/m=2.50 (example 24) was manufactured.

The peak wavelength and the emission intensity were measured for the manufactured samples of the examples 16 to 24. This measurement result is shown in table 3 and FIG. 4. Here, in FIG. 4, the relative intensity of the emission intensity of the phosphor sample is taken on the ordinate axis, and the o/m ratio is taken on the abscissa axis. Note that regarding the emission intensity, the value of the emission intensity in the peak wavelength of o/m=1.25 (example 20) was standardized as 100%. Also, the light with the wavelength of 405 nm was used as the excitation light.

Examples 25 to 30

In examples 25 to 30, the value of the a/m ratio was changed and the mixing composition and the target composition for obtaining the phosphor having strong emission intensity were examined.

Namely, in the phosphor expressed by the mixing composition formula of the raw materials expressed by $SrAlaSi_{6.5}ON_n$:Eu (Eu/(Sr+Eu)=0.030, n=2/3m+a+4/3b−2/3o, m=1, o=1, b=6.5), the samples, with the molar ratio of Sr, Si, and O fixed to 1, 6.5, 1, respectively and the a/m ratio set in a range of 0.5 to 2.0 were mixed/fired, and the emission intensity was measured. (b/m=6.5, o/m=1.0)

First, the examples 25 to 30 were manufactured by the following procedure. Commercially available $SrCO_3$(3N), Al₂O₃(3N), AlN(3N), Si₃N₄(3N), and Eu₂O₃(3N) were prepared as the raw materials, and in the same way as the example 1, the phosphor sample was manufactured excepting that the mixing ratio of each raw material was adjusted so that each raw material had a prescribed a/m ratio. However, the value of the a/m ratio was set at a/m=0.50 (example 25), a/m=0.75 (example 26), a/m=1.00 (example 27), a/m=1.50 (example 28), a/m=1.75 (example 29), a/m=2.00 (example 30).

The manufactured phosphor samples of the examples 25 to 30 were irradiated with the light with the wavelength of 405 nm as the excitation light, and the peak wavelength and the emission intensity were measured. Then, the emission intensity was measured, with the value of the emission intensity in the peak wavelength of a/m=1.00 (example 27) standardized as 100%. The raw material mixing amount and a measurement result of the phosphor sample of the examples 25 to 30 are shown in table 4 and FIG. 5. FIG. 5 shows a graph in which the emission intensity of the phosphor samples of the examples 25 to 30 is plotted, with the relative intensity of the emission intensity of the phosphor samples taken on the ordinate axis, and the a/m ratio taken on the abscissa axis.

As is clarified from the table 4 and FIG. 5, in each phosphor, the strongest emission intensity is exhibited in the vicinity of a/m=1.00. This reveals that the ratio of Al in b/m=6.5 is preferably in the vicinity of a/m=1.00. Meanwhile, when the value of a/m exceeds 1.25, the emission characteristic shows blue emission. However, yellow emission having an emission peak in the vicinity of the wavelength of 600 nm is also exhibited stronger. This is because, similarly to the explanation of the examples 7 to 15, when the value of a/m exceeds 1.25, the balance of Al, Si, O, and N is collapsed, to generate the impurity phases emitting yellow and orange lights having different product phases from the target product phase, thus deteriorating an original blue emission characteristic.

Note that the impurity phase having the emission peak in the vicinity of the wavelength of 600 nm is considered to correspond to a Sr—Al—Si—O—N:Eu based phosphor shown in the patent application No. 2005-61627. Then, in the phosphor, with the value of a/m exceeding 1.25, it appears that the blue phosphor of the present invention and the yellow and orange phosphor generated as the impurity phases are simultaneously generated and mixed. Therefore, by irradiating the phosphor with the excitation light with the wavelength from 250 nm to 430 nm, the lights of the blue color and yellow color are mixed, thereby obtaining the emission color of white. Therefore, this phosphor can be used as the phosphor for the emission device showing white emission individually.

Examples 31 to 35

In examples 31 to 35, the relation between the concentration of an activator element z (Eu) and the emission intensity was examined. In the composition formula of the phosphor manufactured in the example 20, a measurement sample was manufactured by adjusting the mixing ratio of the raw materials of Sr and Eu, so that the relation between the activator Eu and Sr becomes m+z=1.

First, the examples 31 to 35 were manufactured by the following procedure.

The mixing ratio of each raw material of commercially available SrCO₃(3N), AlN(3N), Si₃N₄(3N), and Eu₂O₃(3N) as the raw materials were adjusted, and in the same way as the example 20, the samples of the examples 31 to 35 were manufactured, with Eu activating concentration set at Eu/(Sr+Eu)=0.001 (example 31), Eu/(Sr+Eu)=0.005 (example 32), Eu/(Sr+Eu)=0.020 (example 33), Eu/(Sr+Eu)=0.050 (example 34), Eu/(Sr+Eu)=0.100 (example 35).

The manufactured phosphor sample of the examples 31 to 35 was irradiated with the light with the wavelength of 405 nm as the excitation light, and the peak wavelength and the emission intensity were measured.

Then, the emission intensity was measured, with the value of the emission intensity in the peak wavelength of Eu/(Sr+Eu)=0.050 (example 34) standardized as 100%. Table 5 and FIG. 6 show the raw material mixing amount and the measurement result of the phosphor samples of the examples 31 to 35. FIG. 6 shows a graph in which the emission intensity of the phosphor samples of the examples 31 to 35 is plotted, with the relative intensity of the emission intensity of the phosphor samples taken on the ordinate axis, and the value of Eu/(Sr+Eu) taken on the abscissa axis.

As is clarified from the table 5 and FIG. 6, in a region of smaller value of Eu/(Sr+Eu), the emission intensity is increased with an increase of the value of Eu/(Sr+Eu), showing the peak in the vicinity of Eu/(Sr+Eu)=0.050. This is because most appropriate activator concentration is exhibited in the vicinity of Eu/(Sr+Eu)=0.050, and when the activator concentration is under 0.05, concentration quenching due to excessive Eu can be prevented.

Meanwhile, as is clarified from the result of the table 5, it is confirmed that the value of the peak wavelength in the emission spectrum is shifted to the longer wavelength side, with the increase of Eu/(Sr+Eu).

TABLE 4

|  | | MIXING AMOUNT OF LAW MATERIALS/mol | | | | PEAK WAVELENGTH | EMISSION INTENSITY |
| --- | --- | --- | --- | --- | --- | --- | --- |
|  | a/m | SrCO₃ | AlN | Si₃N₄ | Eu₂O₃ | (nm) | (%) |
| EXAMPLE 25 | 0.50 | 0.970 | 0.500 | 2.167 | 0.015 | 460.9 | 71.1 |
| EXAMPLE 26 | 0.75 | 0.970 | 0.750 | 2.167 | 0.015 | 460.5 | 97.1 |
| EXAMPLE 27 | 1.00 | 0.970 | 1.000 | 2.167 | 0.015 | 459.7 | 100.0 |
| EXAMPLE 28 | 1.25 | 0.970 | 1.250 | 2.167 | 0.015 | 458.3 | 56.2 |
| EXAMPLE 29 | 1.50 | 0.970 | 1.500 | 2.167 | 0.015 | 458.8 | 44.1 |
| EXAMPLE 30 | 2.00 | 0.970 | 2.000 | 2.167 | 0.015 | 458.9 | 42.0 |

TABLE 5

| | MIXING AMOUNT OF LAW MATERIALS/mol | | | | | PEAK WAVELENGTH (nm) | EMISSION INTENSITY (%) |
|---|---|---|---|---|---|---|---|
| | $SrCO_3$ | AlN | $Al_2O_3$ | $Si_3N_4$ | $Eu_2O_3$ | | |
| EXAMPLE 31 | 0.999 | 0.833 | 0.083 | 2.167 | 0.001 | 448.6 | 24.8 |
| EXAMPLE 32 | 0.995 | 0.833 | 0.083 | 2.167 | 0.003 | 452.9 | 38.7 |
| EXAMPLE 33 | 0.980 | 0.833 | 0.083 | 2.167 | 0.010 | 453.6 | 78.5 |
| EXAMPLE 34 | 0.950 | 0.833 | 0.083 | 2.167 | 0.025 | 454.2 | 100.0 |
| EXAMPLE 35 | 0.900 | 0.833 | 0.083 | 2.167 | 0.050 | 462.3 | 84.5 |

Examples 36 to 44

In examples 36 to 44, the sample of adding $MnO_2$, $SrF_2$, $BaCl_2$, $AlF_3$, BaO, $SrCl_2$, GaN, and $Li_2CO_3$ to the phosphor sample having the composition of the example 20 was manufactured, and the average particle size (D50), the specific surface area (BET), and the emission characteristic (the emission intensity and the peak wavelength) of the obtained phosphor were measured.

First, the examples 36 to 44 were manufactured by the following procedure.

The commercially available $SrCO_3$(3N), AlN(3N), $Al_2O_3$, $Si_3N_4$(3N), and $Eu_2O_3$(3N) were prepared as the raw materials, and commercially available $SrF_2$, $BaCl_2$, $AlF_3$, $MnO_2$, BaO, $SrCl_2$, GaN, $LiCO_3$ were prepared as additives. In the same way as the example 20, each raw material was weighed to obtain a mixed raw material. 1.0 wt % of each additive was added to the mixed raw material before firing and mixed therein by using the mortar under the atmospheric air. Here, $MnO_2$ was added in the example 37, $SrF_2$ was added in the example 38, $BaCl_2$ was added in the example 39, $AlF_3$ was added in the example 40, BaO was added in the example 41, $SrCl_2$ was added in the example 42, GaN was added in the example 43, and $LiCO_3$ was added in the example 44, respectively. No additive was added to the example 36, and the example 36 and the example 20 have the same composition. The raw materials thus mixed were put in the BN crucible, and after vacuously exhausting the inside of the furnace once, temperature was increased at 15° C./min up to 1800° C. with the pressure in the furnace set at 0.05 MPa in the nitrogen atmosphere (flow state at 20.0 L/min), and the raw materials were retained/fired at 1800° C. for 3 hours, then, the temperature was decreased from 1800° C. to 50° C. to cool the raw materials for 90 minutes. Thereafter, a fired sample was pulverized by using the mortar up to a proper particle size in the atmospheric air, to thereby obtain the phosphor sample of the examples 36 to 44.

The average particle size (D50) and the specific surface area (BET) were measured, for the phosphor sample of the samples 36 to 44, and these phosphor samples were irradiated with the light with the wavelength of 405 nm, to measure the peak wavelength and the emission intensity.

Then, the emission intensity was measured, with the emission intensity at the peak wavelength of the example 36 standardized as 100%. The measurement result is shown in table 6.

From the result of the table 6, it is found that the example 38 added with $SrF_2$, being the salt of the constituent element of the phosphor of the present invention and the example 40 added with $AlF_3$ are the phosphor powder with low BET (or large average particle size D50) while maintaining high emission characteristic, if compared with an additive-free example 36. Also, as a result of performing an SEM observation for each sample, it is found that any one of the samples has a smooth particle surface. When the particle surface is smooth, a dense film can be manufactured when a phosphor film is manufactured by using the aforementioned particle. For example, when this phosphor film is used as a coating type phosphor film such as a display, the film with high luminance can be obtained. Namely, in the phosphor according to the present invention, by containing fluorine, it is found that the phosphor and the phosphor film with high luminance can be obtained.

Meanwhile, the example 39 added with $BaCl_2$ and the example 37 added with $MnO_2$ are compared with the additive-free example 36, it is found that the peak wavelength of the emission spectrum is shifted to the longer wavelength side by about 5.0 nm by addition of this additive. Here, from the result of the composition analysis, it is found that the peak wavelength of the emission spectrum can be shifted to the longer wavelength side when Ba and Mn are brought into a solid-solution into a phosphor matrix, because the result is obtained such that 2.0 wt % of Ba is contained in the example 39 and 1.2 wt % of Mn is contained in the example 37. By this shift, the emission spectrum is shifted to the longer wavelength side where naked-eye visibility is high, and therefore for example the luminance of the white LED in which this phosphor is assembled can be improved, and the white LED of various color white LED can be manufactured.

Further, in the example 41 added with BaO, the example 42 added with $SrCl_2$, the example 43 added with GaN, and the example 44 added with $LiCO_3$, the emission intensity is substantially not changed when compared with the additive-free example 36, and the phosphor powder with small particle size is obtained. Namely, when chloride, oxide, and nitride are used as the additive, it is found that the phosphor with high luminance due to a peak shift and a fine phosphor film due to a smaller particle size can be obtained in some cases.

TABLE 6

| | ADDITIVE | | EMISSION CHARACTERISTIC | | POWDER CHARACTERISTIC | |
|---|---|---|---|---|---|---|
| | KIND | ADDED AMOUNT | PEAK WAVELENGTH (nm) | RELATIVE EMISSION INTENSITY | PARTICLE SIZE D50 (μm) | BET (m²/g) |
| EXAMPLE 36 | — | — | 454.5 | 100.0 | 20.27 | 0.489 |
| EXAMPLE 37 | $MnO_2$ | 1.0 wt % | 460.6 | 81.1 | 14.03 | 0.589 |
| EXAMPLE 38 | $SrF_2$ | 1.0 wt % | 454.0 | 97.8 | 23.01 | 0.386 |

TABLE 6-continued

|  | ADDITIVE | | EMISSION CHARACTERISTIC | | POWDER CHARACTERISTIC | |
|---|---|---|---|---|---|---|
|  | KIND | ADDED AMOUNT | PEAK WAVELENGTH (nm) | RELATIVE EMISSION INTENSITY | PARTICLE SIZE D50 (μm) | BET (m²/g) |
| EXAMPLE 39 | $BaCl_2$ | 1.0 wt % | 460.6 | 82.3 | 15.12 | 0.592 |
| EXAMPLE 40 | $AlF_3$ | 1.0 wt % | 455.8 | 93.7 | 23.72 | 0.436 |
| EXAMPLE 41 | BaO | 1.0 wt % | 455.5 | 98.1 | 18.81 | 0.501 |
| EXAMPLE 42 | $SrCl_2$ | 1.0 wt % | 456.0 | 97.0 | 16.01 | 0.572 |
| EXAMPLE 43 | GaN | 1.0 wt % | 454.1 | 99.0 | 19.12 | 0.510 |
| EXAMPLE 44 | $LiCO_3$ | 1.0 wt % | 454.1 | 94.2 | 18.97 | 0.538 |

Example 45 to Example 50

In examples 45 to 50, the value of the o/m ratio is changed in a/m=0, and the mixing composition and the target composition for obtaining the phosphor having strong emission intensity were examined.

Namely, the sample was manufactured, so that in the phosphor of the raw material mixing composition not containing Al expressed by $SrSi_bO_oN_n$:Eu(Eu/(Sr+Eu)=0.030, n=2/3 m+a+4/3b−2/3o, a/m=0), the molar ratio of Sr and Si is fixed to 1, 7, respectively, the value of the o/m ratio is set in a range from 0.0 to 1.5, and the emission intensity was measured.

First, the examples 45 to 50 were manufactured by the following procedure.

Commercially available $Si_3N_2$(2N), $Si_3N_4$(3N), and $Eu_2O_3$(3N) were prepared, and each raw material was weighed to obtain 0.970/3 mol of $Sr_3N_2$, 7/3 mol of $Si_3N_4$, and 0.030/2 mol of $Eu_2O_3$, so that the molar ratio of each element is Sr:Si:Eu=0.970:7:0.030, and was mixed in the glove box by using the mortar. The mixed raw material was put in the BN crucible and after vacuously exhausting the inside of the furnace once, temperature was increased at 15° C./min up to 1800° C. with the pressure in the furnace set at 0.05 MPa in the nitrogen atmosphere (flow state at 20.0 L/min), and the raw materials were retained/fired at 1800° C. for 3 hours, then, the temperature was decreased from 1800° C. to 50° C. to cool the raw materials for 90 minutes. Thereafter, the fired sample was pulverized by using the mortar up to a proper particle size in the atmospheric air, to thereby obtain the phosphor sample according to the example 45 expressed by the mixing composition formula $SrSi_7N_{10}$:Eu (wherein Eu/(Sr+Eu)=0.030).

In the example 46 to the example 50, the change of the characteristic was checked, when the o/m ratio (oxygen concentration) of the example 45 was set in the range from 0.5 to 1.5. In manufacturing each sample, $SrCO_3$(3N) and $SiO_2$(3N) were prepared as the raw materials for supplying oxygen, other than the commercially available $Sr_3N_2$(2N), $Si_3N_4$(3N), and $Eu_2O_3$(3N), and the sample was manufacture in the same way as the example 45, other than a part of N(nitrogen) of the example 45 was replaced with O(oxygen) by mixing each raw material with a prescribed molar ratio.

$Sr_3N_2$, $SrCO_3$, $Si_3N_4$, and $Eu_2O_3$ were used as the raw materials for the o/m ratio such as o/m=0.50 (example 46) and o/m=0.75 (example 47), and $SrCO_3$, $Si_3N_4$, $Eu_2O_3$ were used for o/m=1.00 (example 48), and $SrCO_3$, $SiO_2$, $Si_3N_4$, $Eu_2O_3$ were used for o/m=1.25 (example 49) and o/m=1.50 (example 50).

For example, in the example 46, 0.50 mol of $SrCO_3$, (0.970−0.50)/3 mol of $Sr_3N_2$, 7/3 mol of $Si_3N_4$, and 0.030/2 mol of $Eu_2O_3$ may be weighed, and in the example 49, 0.970 mol of $SrCO_3$, (1.25−1.00)/2 mol of $SiO_2$, (7−(1.25−1.00)/2)/3 mol of $Si_3N_4$, and 0.030/2 mol of $Eu_2O_3$ may be weighed.

The manufactured phosphor samples of the examples 45 to 50 were irradiated with the light with the wavelength of 405 nm as the excitation light, and the peak wavelength and the emission intensity were measured. This measurement result is shown in table 7 and FIG. 7. Here, in FIG. 7, the relative intensity of the emission intensity of the phosphor samples is taken on the ordinate axis, and the o/m ratio is taken on the abscissa axis. Note that the value of the emission intensity in the peak wavelength of o/m=1.25 (example 49) was set at 100%.

As is clarified from the result of the table 7 and FIG. 7, the emission intensity of each phosphor becomes stronger as the value of the o/m ratio becomes larger, showing the strongest emission intensity when o/m=1.25. Further, the emission intensity is significantly decreased when the value of the o/m ratio is 1.50 or more.

This is because by replacing a part of N (nitrogen) with O (oxygen), energy from the excitation light which is absorbed in a matrix body can be efficiently transferred up to the center of the light emission, and the $SrCO_3$ used as the Sr raw material acts as the flux, to thereby accelerate the solid phase reaction. However, when the o/m ratio becomes larger than 1.25, the sample is vitrified, and the structure around Eu ion, which is the center of the light emission, is formed irregular, thereby generating variance in distance between luminescence centers, resulting in deterioration in the emission intensity.

Specifically, in the composition containing a slight amount of oxygen (samples 46 to 50), the crystal structure is optimized and the phosphor having the excellent emission characteristic can be obtained.

In addition, from the composition analysis result of the phosphor after firing shown in table 7, a tendency that Si and were reduced from the mixing composition formula was observed. Accordingly, in the examples 45 to 50, it appears that the phosphor having a new structure of $SrSi_6N_8$:Eu with a composition of x=0 not conventionally reported, being the structure of $SrSi_6N_8$:Eu with $SrSi_6N_8$ having small amount of Si as the matrix, or the structure of $SrAl_xSi_{6-x}O_{1+x}N_{8-x}$ is generated.

TABLE 7

| | o/m | $Sr_3N_2$ | $SrCO_3$ | $Si_3N_4$ | $SiO_2$ | $Eu_2O_3$ | PEAK WAVELENGTH (nm) | EMISSION INTENSITY (%) |
|---|---|---|---|---|---|---|---|---|
| | | | MIXING AMOUNT OF LAW MATERIALS/mol | | | | | |
| EXAMPLE 45 | 0.00 | 0.323 | — | 2.333 | — | 0.015 | 455.9 | 56.6 |
| EXAMPLE 46 | 0.50 | 0.157 | 0.500 | 2.333 | — | 0.015 | 455.5 | 82.5 |
| EXAMPLE 47 | 0.75 | 0.073 | 0.750 | 2.333 | — | 0.015 | 455.3 | 95.0 |
| EXAMPLE 48 | 1.00 | — | 0.970 | 2.333 | — | 0.015 | 455.5 | 99.2 |
| EXAMPLE 49 | 1.25 | — | 0.970 | 2.292 | 0.125 | 0.015 | 455.5 | 100.0 |
| EXAMPLE 50 | 1.50 | — | 0.970 | 2.250 | 0.250 | 0.015 | 455.5 | 59.3 |

Examples 51 and 52

In examples 51 and 52, an object is to make the oxygen concentration uniform and realize a uniform dispersion of the Eu element in the phosphor sample, and in a firing step, firing was performed divided into multiple numbers of times.

First, The commercially available $SrCO_3$(3N), AlN(3N), $Si_3N_4$(3N), and $Eu_2O_3$(3N) were prepared as the raw materials, and each raw material was weighed to obtain 0.950 of $SrCO_3$, 0.83 mol of AlN, 0.08 mol of $Al_2O_3$, 6/3 mol of $Si_3N_4$, and 0.050/2 mol of $Eu_2O_3$, so that the molar ratio of each element becomes Sr:Al:Si:Eu=0.950:1:6.0:0.050, and mixed by using the mortar in the atmospheric air. The raw materials thus mixed were put in the BN crucible, and after vacuously exhausting the inside of the furnace once, temperature was increased at 15° C./min up to 1600° C. with the pressure in the furnace set at 0.05 MPa in the nitrogen atmosphere (flow state at 20.0 L/min), and the raw materials were retained/fired at 1600° C. for 3 hours, then, the temperature was decreased from 1600° C. to 50° C. to cool the raw materials for 90 minutes.

Thereafter, a fired sample was taken out from the furnace and was pulverized by using the mortar up to a proper particle size in the atmospheric air, and was put in the crucible again and set in the firing furnace. Then, after vacuously exhausting the inside of the furnace once, temperature was increased at 15° C./min up to 1800° C. with the pressure in the furnace set at 0.05 MPa in the nitrogen atmosphere (flow state at 20.0 L/min), and the raw materials were retained/fired at 1800° C. for 3 hours, then, the temperature was decreased from 1800° C. to 50° C. to cool the raw materials for 90 minutes, and the fired sample was taken out from the furnace. The obtained sample was pulverized by using the mortar up to a proper particle size in the atmospheric air, to thereby obtain the phosphor of the example 51.

Next, in the example 52, although the firing condition was the same as that of the example 51, firing was performed by air-tightly closing the inside of the furnace without allowing the nitrogen atmosphere to circulate therein, and the sample was manufactured.

The peak wavelength and the emission intensity of the emission as the emission characteristics were measured for the manufactured samples 51 and 52. This measurement result is shown in table 8. Note that in measuring the emission intensity, the value of the emission intensity in the peak wavelength of the example 20 is standardized as 100%. Note that the monochromatic light with the wavelength of 405 nm was used as the excitation light.

As is clarified from the result of the table 8, in the firing step, by performing firing divided into multiple numbers of times, it was found that the emission intensity of the phosphor sample was improved by 10% or more. This is because by mixing/stirring the phosphor sample after first firing and performing second firing or thereafter for the phosphor sample, the composition of the phosphor sample is further made to be uniform and the emission characteristic is improved.

In addition, when the samples of the example 51 and the example 52 were compared, further improvement of the emission characteristic was observed in the example 52 than the example 51.

This is because during firing of the phosphor samples, although reduction of oxygen is rapidly progressed due to high temperature, the phosphor samples are fired, with the inside of the firing furnace air-tightly sealed without allowing the nitrogen atmosphere to flow thereinto for the second firing and thereafter, thereby releasing excessive oxygen in the phosphor samples, so as to exhibit an effect of preventing a phenomenon of reducing the oxygen beyond the amount of oxygen necessary for maintaining a proper phosphor composition. Accordingly, in order to perform firing, with the inside of the firing furnace air-tightly sealed, the oxygen concentration in the phosphor samples is adjusted to the amount of oxygen necessary for maintaining the proper phosphor composition. Specifically, a sample for determining the oxygen concentration in the phosphor sample was manufactured, and an optimal oxygen concentration was obtained by performing the first firing under each condition.

As a sealing method of the firing furnace, a method of putting a lid on the crucible filled with the phosphor samples is easy and preferable. However, by stopping the circulation of the atmosphere gas, a sealing effect can be obtained. Therefore, by the method of stopping the circulation of the atmosphere gas for a prescribed time also, the effect of sealing can be similarly obtained.

TABLE 8

| | PEAK WAVELENGTH (nm) | RELATIVE EMISSION INTENSITY | CHROMATICITY x | CHROMATICITY y | O (wt %) | N (wt %) |
|---|---|---|---|---|---|---|
| EXAMPLE 20 | 451.4 | 100.0 | 0.1636 | 0.0618 | 2.30 | 29.5 |
| EXAMPLE 51 | 450.3 | 110.6 | 0.1500 | 0.0432 | 1.96 | 29.6 |
| EXAMPLE 52 | 455.0 | 132.7 | 0.1582 | 0.0641 | 4.27 | 34.6 |

Examples 53, 54, 55, 56, 57

Examples 53 to 57 are the same as the phosphor samples of the example 20. However, the phosphor samples were manufactured, with element Ca and element Ba employed as alternatives of element Sr of the phosphor samples.

First, in manufacturing the phosphor samples of the examples 53 to 57, by blending and mixing $SrCO_3$ (3N), $CaCO_3$ (3N), $BaCO_3$(3N), being the raw materials of the phosphor, at a prescribed molar ratio, the composition of the element M in a phosphor sample composition formula was changed. Here, when one or more kinds of element M were mixed and used, they were mixed by being adjusted so that the number of moles for the sum total of the element M containing such plurality of elements was constant. Specifically, when the blending ratio of the element M of the example 20 was set to be Sr1.0, the blending ration is adjusted to obtain Sr0.75:Ba0.25 for the sample of the example 53, Sr0.5:Ba0.5 for the sample of the example 54, Sr0.25:Ba0.75 for the sample of the example 55, Ba1.0 for the sample of the example 56, and Ca0.25:Sr0.75 for the sample of the example 57. Then, the manufacturing method of the phosphor sample was performed in the same way as that of the example 20, and the emission intensity and the luminance of the phosphor samples of the examples 53 to 57 were measured.

The measurement result was explained with reference to the table 9. Note that in measuring the emission intensity and the luminance, the value of the emission intensity and the luminance in the peak wavelength of the emission of the phosphor sample of the example 20 was standardized as 100%. Note that the light with the wavelength of 405 nm was used as the excitation light.

From the result of the table 9, by employing Ca and Ba as alternatives of Sr as the element M, an emission wavelength was in the vicinity of 460 nm and a tendency to shift to the longer wavelength side than the example 20 was observed. Meanwhile, the tendency that the emission intensity and the luminance were more deteriorated than the example 20 was observed. However, when a replacement ratio of the element Sr by the element Ba in the element M is 50% or less, it is found that the emission wavelength can be shifted to the longer wavelength side without deteriorating the emission intensity of the phosphor sample so much. Accordingly, it is found that the replacement of the element Sr by the element Ba in the element M is a useful method for obtaining the emission color of the longer wavelength side.

(Examination of the Impurities in the Phosphor by the Measurement Result of the XRD)

By comparing the X-ray diffraction pattern of each phosphor of the examples 13, 20, 45, 49, 52 shown in FIG. 8 by the powder method, and the X-ray diffraction pattern of each phosphor of the examples 2, 4, 6 shown in FIG. 2 by the powder method, the examination of the impurities in the phosphor by using the measurement result of the XRD was performed.

As is clarified from the diffraction pattern of FIG. 8, each phosphor of the examples 13, 20, 45, 49, 52 shows the diffraction peak with strongest intensity in the Bragg angle (2θ) range from 35° to 37° in the X-ray diffraction pattern by the powder method using the CoKα ray. Further, 2, 2, 1, 1 characteristic diffraction peaks are observed in the Bragg angle range from 23.60 to 25.6°, 33° to 35°, 39.7° to 40.7°, 43° to 44° of the X-ray diffraction pattern, respectively, and when the relative intensity of the diffraction peaks with strongest intensity observed in the Bragg angle range (2θ) from 35° to 37° is set at 100%, the relative intensity of these diffraction peaks show 2.0% or more and 40% or less diffraction peaks.

Also, in the X-ray diffraction pattern by the powder method of each phosphor of the examples 13, 20, 45, 49, 52 shown in FIG. 8, in the same way as the examples 2, 4, 6 shown in FIG. 2, smaller diffraction peaks in the Bragg angle (2θ) range from 26° to 33°, 38.7° to 39.7°, and 42.0° to 42.8° are preferable. Specifically, when the relative intensity of the diffraction peak with strongest intensity observed in the Bragg angle (2θ) range from 35° to 37° is set at 100%, the relative intensity is preferably 10% or less. From the analysis result of the crystal phase also, it appears that the phase showing the diffraction peaks observed in the aforementioned range are impurity phases different from the phase showing the peak of the emission spectrum in the wavelength range from 400 nm to 500 nm.

Further, when the diffraction peak with highest intensity in the Bragg angle (2θ) range from 35° to 37° is focused in the X-ray diffraction pattern by the powder method using the CoKα ray shown in FIG. 2 and FIG. 8, it is found that there are two peaks by containing Al in the constituent element as shown in each phosphor of the examples 2, 4, 6, 13, 20, 52, while the diffraction peak is one in the diffraction pattern with no Al mixed therein shown in the examples 46 and 49. Judging from the result that each phosphor of the examples 2, 4, 6, 13, 20, 52 is more excellent than the examples 45 and 49 in

TABLE 9

|  | Ca | Sr | Ba | PEAK WAVELENGTH (nm) | RELATIVE EMISSION INTENSITY | RELATIVE LUMINANCE |
|---|---|---|---|---|---|---|
| EXAMPLE 20 | — | 1.00 | — | 452.9 | 100.0 | 100.0 |
| EXAMPLE 53 | — | 0.75 | 0.25 | 461.0 | 79.0 | 46.3 |
| EXAMPLE 54 | — | 0.50 | 0.50 | 459.9 | 92.1 | 38.0 |
| EXAMPLE 55 | — | 0.25 | 0.75 | 460.0 | 93.3 | 38.5 |
| EXAMPLE 56 | — | — | 1.00 | 460.0 | 58.0 | 34.5 |
| EXAMPLE 57 | 0.25 | 0.75 | — | 462.4 | 11.4 | 216.1 | emission characteristics, it is found that the emission characteristic is becoming more excellent in the phosphor with two peaks by containing Al.

(Examination of the Composition Analysis, Particle Size, and True Density of the Phosphor)

The result of the composition analysis, the particle size, and the true density of the samples manufactured in the examples 13, 20, 49, and 52 were examined.

In each phosphor, the results of the composition analysis, the average particle size, and the specific surface area are shown in table 10, and an SEM photograph of the sample of the example 20 is shown in FIG. 9. Here, FIG. 9(A) shows a photograph with magnification of 250 and FIG. 9(B) shows a photograph with magnification of 1000.

First, when the result of the composition analysis shown in table 10 is observed, although there is a deviation in a theoretical value obtained from a constitutional ratio of the constitutional elements and the compositional formula $SrAl_xSi_{6-x}O_{1+x}N_{8-x}$, the theoretical value is equal to the value when x=0.8 to 0.9 in the examples 13, 20, 52, and when x=0 in the example 49. As a factor of deviation, measurement error or the impurities mixed therein during manufacturing the phosphor can be considered. However, because of $Si_3N_4$ present as the impurity in the sample, it can be so considered that the ratio of Sr and Al is seemingly made smaller. In addition, observed. Therefore, from the point of the improvement of crystallinity and the improvement of the emission characteristic, the plate-shaped particles are preferably contained in the first primary particle.

Further, when the true density measurement is performed for the samples of the examples 13, 20, 49, 52, it is found that each phosphor shows the numerical value in the vicinity of 3.42 g/cc. Note that in measuring the true density, an Ultrapycnometer 1000 by QUANTACHROME INC., was used. In an ideal $Sr_2Al_2Si_{10}O_4N_{14}$ structure, the true density shows the numerical value in the vicinity of 3.60 g/cc. However, the true density of this phosphor is a lower value than an ideal value. This is because the generated phosphor sample is more deficient of oxygen than the theoretical composition as shown in the composition analysis result, or has a composition with smaller amount of oxygen than the theoretical composition. Namely, it can be so considered that the true density is decreased by deficient amount or reduction amount of oxygen atoms, or the product phase of the phosphor sample is mixed with $Si_3N_4$ of low true density, and therefore the true density is seemingly decreased. Incidentally, even if the oxygen atoms are deficient or the impurity phases are contained, this phosphor sample shows an excellent emission characteristic as described above. Therefore, it is found that the true density of the phosphor of the present invention is preferably in the range from 3.40 g/cc to 3.65 g/cc.

TABLE 10

| | Sr (wt %) | Al (wt %) | Si (wt %) | O (wt %) | N (wt %) | Eu (wt %) | OTHERS (wt %) | PARTICLE SIZE D50 (μm) | BET ($m^2$/g) | TRUE DENSITY (g/cc) |
|---|---|---|---|---|---|---|---|---|---|---|
| EXAMPLE 13 | 22.7 | 5.10 | 38.1 | 2.50 | 30.3 | 1.20 | 0.1 | 16.83 | 0.500 | 3.422 |
| EXAMPLE 20 | 20.1 | 5.50 | 39.9 | 2.30 | 29.5 | 1.10 | 1.6 | 16.67 | 0.520 | 3.462 |
| EXAMPLE 49 | 23.9 | — | 42.8 | 0.69 | 31.2 | 1.17 | 0.2 | 17.03 | 0.425 | 3.520 |
| EXAMPLE 52 | 21.6 | 6.11 | 37.4 | 4.19 | 28.3 | 1.89 | 0.5 | 22.51 | 0.211 | 3.428 | since the amount of oxygen of the examples 13, 20, 52 is smaller than by several percentage than a theoretical composition, the generated sample possibly has an oxygen deficit composition, or a composition with less amount of oxygen than the theoretical composition. Accordingly, when the amount of oxygen in the phosphor sample can be properly adjusted by controlling the manufacturing condition, the phosphor with further optimized crystal structure and higher efficiency would be obtained. Note that the analysis result is that the concentration of elements Fe, Ni, Co is 1000 ppm or less and the concentration of C and B is 200 ppm or less in any one of the samples of the examples 13, 20, 42, 52, and an element concentration to deteriorate the emission characteristic is extremely small.

In addition, when the average particle size (D50) is measured by a laser Doppler measurement method for the samples of the examples 13, 20, 49, 52, any one of the sample of these examples is sized at not less than 1.0 μm and not more than 50.0 μm. Then, when the above samples are formed into a paste and applied on various places, the coating density can be increased, to thereby realize a coating film having high emission intensity and luminance. Moreover, as is clearly shown in the SEM photograph of FIG. 9, the phosphor powder thus obtained contains a primary particle with particle size of 50.0 μm or less, and an aggregate in which the primary particles are aggregated each other. Thus, it is found that the aforementioned phosphor powder contains the primary particle and the aggregate thereof. Note that as the primary particle grows, formation of plate-shaped particles is From the XRD pattern of each phosphor sample of the examples 13, 20, 49, 52, the analysis of the lattice constant and the crystal volume of the crystal lattice of each phosphor sample, and a crystallite size of the phosphor was performed. The analysis result is shown in table 11. From the analysis result, the crystal volume of each phosphor sample of the examples 13, 20, 49, 52 is 345 Å$^3$ or more and 385 Å$^3$ or less, and the lattice constant "a" of each crystal lattice is 7.85 Å or more and 8.28 Å or less, "b" is 9.26 Å or more and 9.58 Å or less, "c" is 4.80 Å or more and 4.92 Å or less, and the crystallite size is 50 nm or more. Here, when the relation between the emission characteristic and the crystal lattice volume of each phosphor sample is observed, the emission characteristic is improved with the increase of the crystal lattice volume. Namely, it is found that the crystal lattice volume is preferably 353 Å$^3$ or more.

Next, as a result of the XRD pattern of each phosphor sample of the examples 13, 20, 49, 52, it is found that in any one of the phosphor powders, the diffraction intensity of a surface (130) is high, which is selectively oriented, and the oxygen atoms of a 2b site is deficient.

Meanwhile, the phosphor powder obtained by the example 52 has a small deficient amount of the oxygen atoms of the 2b site, compared to the phosphor powder obtained by the examples 13, 20, 49, and from the composition analysis result shown in the table 10, the oxygen concentration in the phosphor powder is slightly high. Accordingly, in the phosphor powder obtained by the example 52, it appears that by replenishing the oxygen atoms to an oxygen deficient site in the crystal lattice so as to be further optimized, the crystal lattice volume is increased and the emission characteristic is improved.

TABLE 11

| | LATTICE CONSTANT | | | LATTICE VOLUME | |
|---|---|---|---|---|---|
| | a (Å) | b (Å) | c (Å) | V (Å³) | Dx (nm) |
| EXAMPLE 13 | 7.896 | 9.292 | 4.835 | 354.8 | 70.8 |
| EXAMPLE 20 | 7.897 | 9.283 | 4.834 | 354.3 | 76.2 |
| EXAMPLE 49 | 7.888 | 9.309 | 4.808 | 353.0 | 98.2 |
| EXAMPLE 52 | 7.910 | 9.319 | 4.866 | 358.7 | 93.5 |

(Examination of Temperature Characteristic of the Phosphor)

Table 12 and FIG. 10 show the result of measuring the temperature characteristic of the emission intensity at temperature from 25° C. to 300° C., for the samples of the examples 13, 20, 49, 52.

First, explanation is given to emission intensity $P_{25}$ at the temperature of 25° C. and emission intensity $P_T$ at the temperature of T° C., and a measurement of a variation of the emission intensity.

The aforementioned emission intensity $P_{25}$ is obtained by measuring the spectrum of the light emitted by an emitter when the phosphor is placed in an environment of 25° C. and is irradiated with the excitation light with a prescribed wavelength as will be described later. The peak having a maximum intensity in this measurement spectrum is defined as the maximum peak, the value of the relative intensity of this peak is defined as $P_{25}$, and this value is defined as 1.0. Next, this phosphor is placed in an environment of T° C., by increasing the temperature from 25° C., and is irradiated with the excitation light in the same way as the measurement at 25° C., to thereby measure the spectrum of the light emitted by the phosphor. In such a measured spectrum, the relative intensity of the peak corresponding to the peak which is defined as the maximum peak during measurement at 25° C. is obtained and the value thus obtained is defined as $P_T$.

Table 12 shows the result of changing the temperature of the samples by using the light with the wavelength of 405 nm as the excitation light, and FIG. 10 is a graph in which the measurement temperature T° C. is taken on the abscissa axis, and the relative intensity of the emission intensity is taken on the ordinate axis. Note that as described above, the relative intensity of the emission intensity of the ordinate axis of the graph according to FIG. 10 shows 25° C., 50° C., 100° C., 150° C., 200° C., 250° C., and 300° C., with each sample $P_{25}$ as a reference as described above. Then, the example 13 is plotted by thin solid line, the example 20 is plotted by thin broken line, the example 49 is plotted by thick solid line, and the example 52 is plotted by one dot chain line.

From the result of the table 12 and FIG. 10, the phosphors of the examples 13, 20, 49, and 52 are capable of obtaining emission with few changes in color tone while maintaining high emission intensity and high luminance, because the deterioration of the emission intensity is small even when the temperature of the phosphor is increased by heat generation of the light emitting part (in the white LED illumination, the temperature would be increased up to the vicinity of 100° C. to 200° C.), and the aforementioned phosphors are considered to be suitable for the phosphor used in the illumination device.

Here, from the aforementioned viewpoint, preferably a deterioration rate of the emission intensity of the phosphor at the temperature from the room temperature to 200° C. is 50% or less $((P_{25}-P_{200})/P_{25} \leq 0.50)$, and further preferably the deterioration rate thereof is 15% or less $((P_{25}-P_{200})/P_{25} \leq 0.15)$. Then, in the temperature characteristic in the emission intensity of the phosphor, the examples 13, 20, 52 containing Al in the constituent elements are more improved than the example 49 not containing Al in the constituent elements, and it is found that particularly the example 52 with large oxygen concentration in the composition of the phosphor out of the examples 13, 20, 52 are improved in the temperature characteristic also, in addition to the emission characteristic. This is because by optimizing the oxygen concentration in the phosphor composition, an entire body of the crystal structure of the phosphor is optimized, and a stable and strong crystal structure is formed, against the variation of an ambient temperature.

TABLE 12

| | RELATIVE EMISSION INTENSITY IN EACH MEASUREMENT TEMPERATURE (TEMPERATURE INCREASE PROCESS) | | | | | | |
|---|---|---|---|---|---|---|---|
| | 25° C. | 50° C. | 100° C. | 150° C. | 200° C. | 250° C. | 300° C. |
| EXAMPLE 13 | 1.00 | 0.95 | 0.86 | 0.75 | 0.62 | 0.47 | 0.32 |
| EXAMPLE 20 | 1.00 | 0.95 | 0.85 | 0.71 | 0.56 | 0.41 | 0.28 |
| EXAMPLE 49 | 1.00 | 0.94 | 0.79 | 0.60 | 0.37 | 0.18 | 0.07 |
| EXAMPLE 52 | 1.00 | 0.97 | 0.91 | 0.82 | 0.70 | 0.55 | 0.39 |

Comparative Examples 3 to 5

The samples of the comparative examples 3 to 5 and the samples of the aforementioned examples 13, 20, 45, 49, 51, 52 are compared.

The comparative example 3 will be explained.

The comparative example 3 provides the phosphor considered to be corresponding to the phosphor $SrSi_7N_{10}$:Eu obtained by replacing Ba with Sr in the phosphor $BaSi_7N_{10}$:Eu described in a publication "On new rare-earth doped M-Si—Al—O—N materials" written by Van Krevel, TU Eindhoven 2000, ISBN 90-386-2711-4, and the patent publication No. 2003-515655. According to these documents, the phosphor having the composition formula $BaSi_7N_{10}$:Eu is fired and manufactured at 1400° C. to 1565° C., and the red phosphor having the emission spectrum with a peak in the wavelength range from 640 nm to 680 nm is manufactured. Therefore, the phosphor sample, having the same composition, fired at a temperature of 1600° C. was manufactured and is set as the comparative example 3.

The comparative examples 4 and 5 will be explained.

The comparative example 4 provides the commercially available phosphor $BaMgAl_{10}O_{17}$:Eu(BAM:Eu) phosphor used as the blue phosphor of the white LED illumination manufactured by combining the near-ultraviolet/ultraviolet LED, R.G.B and other phosphors at present.

The comparative example 5 provides the commercially available phosphor $(Sr, Ca, Ba, Mg)_{10}(PO_4)_6Cl_2$:Eu used as the blue phosphor of the white LED illumination manufactured by combining the near-ultraviolet/ultraviolet LED, R.G.B and other phosphors at present.

The peak wavelength and the emission intensity were measured for the manufactured samples of the comparative examples 3 to 5, and the excitation spectrum was measured for the samples of the comparative examples 4 and 5.

The measurement result is shown in table 13, the emission spectrum is shown in FIG. 11, and the excitation spectrum is shown in FIG. 12, together with the samples of the examples 13, 20, 49, 51, 52. The example 13 is shown by thick solid line, the example 20 is shown by thin solid line, the example 49 is shown by thick broken line, the example 51 is shown by thick one dot chain line, the example 52 is shown by long broken line, the comparative example 3 is shown by thin broken line, the comparative example 4 is shown by thin one dot chain line, and the comparative example 5 is shown by thin two dot chain line.

Then, the measurement result of the X-ray diffraction pattern by the powder method of the example 45 and the comparative example 3 is shown in FIG. 13.

First, the example 45 and the comparative example 3 will be examined.

As is clarified from the results of the tables 7 and 13, FIG. 11 and FIG. 13, in the example 45 and the comparative example 3, the phosphor having the composition formula expressed by $SrSi_7N_{10}$:Eu(wherein Eu/(Sr+Eu)=0.030) is manufactured by using a different firing temperature. Then, it is found that the phosphor showing completely different characteristics is generated and the phosphor of the example 45 is not generated in firing at 1600° C.

Here, as shown in the table 7, in the example 45 fired at 1800° C., the peak of the emission spectrum is observed in the wavelength range from 400 nm to 500 nm. However, in the comparative example 3, the peak of the emission spectrum can not be confirmed in the wavelength range from 400 nm to 500 nm, and the peak of the emission spectrum is observed in the vicinity of the wavelength of 625 nm.

In addition, as shown in FIG. 13, Further, a typical diffraction peak of the phase showing the emission spectrum with a peak in the wavelength range from 400 nm to 500 nm as shown in the example 45 can not be confirmed from the diffraction pattern of the comparative example 3, or even if it can be confirmed, the intensity is significantly weak. Accordingly, when the firing temperature is 1600° C. or less, it is so considered that the phase of the phosphor of the present invention having the emission spectrum with a peak in the wavelength range from 400 nm to 500 nm is not generated.

Next, the examples 13, 20, 49, 51, 52, and the comparative examples 4, 5 will be examined.

As is clarified from the results of the table 13, FIG. 11, FIG. 12, each phosphor of the examples 13, 20, 49, 51, 52 has a stronger emission intensity by about 40%, compared to the comparative example 3 and $BaMgAl_{10}O_{17}$:Eu(BAM:Eu) of the comparative example 4 and $(Sr, Ca, Ba, Mg)_{10}(PO_4)_6Cl_2$:Eu of the comparative example 5 used as the blue phosphor of the LED illumination at present, and has the excitation band with a larger proportion of a covalent bond compared to the comparative example 4, being an oxide phosphor, and the comparative example 5, being a halophosphate phosphor, therefore has an excellent excitation band up to slightly the longer wavelength side, and has the excellent excitation band in particularly the wavelength range from 300 nm to 430 nm. Therefore, by using the blue phosphor of the white LED illumination manufactured by combining the near ultraviolet/ ultraviolet LED, R.G.B and other phosphor, the white LED illumination with higher luminance can be obtained.

In addition, as shown in FIG. 12, it is found that each phosphor of the examples 13, 20, 49, 51, 52 has a flat and excellent excitation band up to the longer wavelength side, compared to the oxide phosphor of the comparative example 4 and the halophosphate phosphor of the comparative example 5, and has the excellent excitation band particularly in the wavelength range from 300 nm to 430 nm.

Here, when the blue phosphor having the maximum emission peak in the wavelength range from 400 nm to 500 nm is used in the emission device using the light with the wavelength of 350 nm or more or the wavelength of the ultraviolet or near ultraviolet as an excitation source, under the excitation by the monochromatic light with the wavelength range from 350 nm to 430 nm, the maximum emission intensity of the emission spectrum in the wavelength range from 400 nm to 500 nm is defined as $P_{max}$, and the minimum emission intensity is defined as $P_{min}$, it is preferable that $P_{min}/P_{max}$ satisfies 30% or more. From this viewpoint, it is found that the phosphor of the examples 13, 20, 49, 51, 52, being the blue phosphor having the excitation spectrum in the wavelength range of 250 nm or more and having the maximum emission peak in the wavelength range from 400 nm to 500 nm shows 30% or more of $P_{min}/P_{max}$ as shown in table 10, and can be used as the phosphor efficiently and stably emitting light even when a wavelength variation of the light emitting elements emitting the excitation light occurs, thus making it possible to suppress the variation of color tone of the white light. Meanwhile, as shown in table 13, the value of the $P_{min}/P_{max}$ of the comparative examples 4, 5 shows 22% or less, and it is found that the variation of the color tone of the white light can hardly be suppressed when the wavelength variation occurs to the light emitting elements emitting the excitation light.

TABLE 13

| | PEAK WAVELENGTH (nm) | EMISSION INTENSITY (%) | $P_{min}/P_{max}$ (%) |
|---|---|---|---|
| EXAMPLE 13 | 451.4 | 100.0 | 45.4 |
| EXAMPLE 20 | 455.5 | 98.7 | 44.0 |
| EXAMPLE 49 | 455.5 | 94.3 | 35.4 |
| EXAMPLE 51 | 450.3 | 110.6 | 45.1 |
| EXAMPLE 52 | 455.0 | 132.7 | 61.6 |
| COMPARATIVE EXAMPLE 3 | 625.6 | 21.1 | — |
| COMPARATIVE EXAMPLE 4 | 455.6 | 56.5 | 9.8 |
| COMPARATIVE EXAMPLE 5 | 448.7 | 51.5 | 21.6 |

(Evaluation as the Light Emission Device Incorporating the Phosphor)

Example 58

In the example 58, the phosphor mixture emitting light having the correlated color temperature of 5200K when excited by the light emitting element (LED) emitting light at the wavelength of 405 nm was manufactured, and the emission characteristic and the color rendering property of this phosphor mixture was evaluated.

1) Preparation of the Phosphor

The blue phosphor $SrAl_{0.8}Si_{5.2}O_{1.8}N_{7.2}$:Eu (the phosphor of the example 20) was manufactured and prepared by the method explained in the embodiment.

The green phosphor $Sr_2Al_2Si_{10}ON_{16}$:Ce was manufactured by the following method.

The commercially available $SrCO_3$(2N), AlN(3N), $Si_3N_4$ (3N), and $CeO_2$(3N) were prepared, and each raw material was weighed so that the molar ratio of each element became Sr:Al:Si:Ce=0.970:1:5:0.030, and mixed in the atmospheric air by using the mortar. The temperature of the raw materials thus mixed was increased at a temperature increasing rate of 15° C./min up to 1800° C. in a nitrogen atmosphere, with the raw materials in a powdery state, and the raw materials were fired with the temperature maintained at 1800° C. for 3 hours, then the temperature was decreased from 1800° C. to 200° C. to cool the raw materials for 1 hour, whereby the phosphor of the composition formula $Sr_2Al_2Si_{10}ON_{16}$:Ce was obtained. The sample thus obtained was pulverized and classified.

Also, a red phosphor $CaAlSiN_3$:Eu was manufactured by the following method.

The commercially available $Ca_3N_2$(2N), AlN(3N), $Si_3N_4$ (3N), and $Eu_2O_3$ (3N) were prepared, and each raw material was weighed so that the molar ratio of each element became Ca:Al:Si:Eu=0.970:1:1:0.030, and mixed in the glove box under the nitrogen atmosphere by using the mortar. The temperature of the raw materials thus mixed was increased at a temperature increasing rate of 15° C./min up to 1500° C. in the nitrogen atmosphere, and the raw materials were fired with the temperature maintained at 1500° C. for 3 hours, then the temperature was decreased from 1500° C. to 200° C. to cool the raw materials for 1 hour, whereby the phosphor of the composition formula $CaAlSiN_3$:Eu was obtained. The sample thus obtained was pulverized and classified.

2) Adjustment of the Phosphor Mixture

The emission spectrum was measured when each of the three kinds of the phosphors $SrAl_{0.8}Si_{5.2}O_{1.8}N_{7.2}$:Eu, $Sr_2Al_2Si_{10}ON_{16}$:Ce, and $CaAlSiN_3$:Eu was irradiated with the excitation light with the wavelength of 403.5 nm, and a relative mixing ratio whereby the correlated color temperature of the phosphor mixture became 5200K was obtained from the emission spectrum by simulation. The simulation result was $(SrAl_{0.8}Si_{5.2}O_{1.8}N_{7.2}:Eu):(Sr_2Al_2Si_{10}ON_{16}:Ce):(CaAlSiN_3:Eu)$=31.8:65.2:3.0, and therefore based on the result thus obtained, each phosphor was weighed and mixed, to obtain the phosphor mixture. However, depending on the emission wavelength (excitation wavelength of the phosphor mixture) of the light emitting part and the emission efficiency of the phosphor by the emission wavelength, a desirable mixing ratio is sometimes deviated from the result of the simulation. In such a case, by properly adjusting the mixing ratio, an actual emission spectrum shape may be arranged.

3) Evaluation by the Light Emitting Element

A mixture of the phosphor mixture and resin was placed on the LED, with the LED (with emission wavelength of 403.5 nm) of ultraviolet light having a nitride semiconductor set as the light emitting part. The mixing ratio of the phosphor and the resin was adjusted to obtain daytime white color corresponding to color temperature of 5200K based on the result, and the white LED illumination (light emitting device) was manufactured by combining with the light emitting part of the LED by the publicly-known method. As a result, the emission spectrum at the time of feeding power of 20 mA to the light emitting element of the white LED illumination is shown in FIG. 14. FIG. 14 is a graph showing the relative emission intensity taken on the ordinate axis, and the emission wavelength (nm) taken on the abscissa axis.

According to the phosphor mixture thus described, the white LED illumination could be obtained. This white LED illumination emits light under the excitation of the ultraviolet light emitted from the light emitting part and emits white light having the emission spectrum with a broad peak in the wavelength range from 400 nm to 700 nm. When the color temperature or the chromaticity of the light emission thus obtained was measured, the color temperature was 5193K, x=0.3402 and y=0.3529. The average color rendering index value (Ra) of the white LED illumination was 91, and the special color rendering index value R9 was 74, R10 was 80, R11 was 90, R12 was 78, R13 was 91, R14 was 95, and R15 was 91. Further, by properly changing the blending amount of phosphors and the blending amount of resin to be mixed, emission color having different color temperature could also be obtained.

A list of measurement data of the chromaticity, color rendering index value, and color temperature or the like of the example 58 is described in table 14.

TABLE 14

| | CHROMATICITY | | COLOR RENDERING INDEX | SPECIAL COLOR RENDERING INDEX | | | | | | | COLOR TEMPERATURE |
|---|---|---|---|---|---|---|---|---|---|---|---|
| | x | y | Ra | R9 | R10 | R11 | R12 | R13 | R14 | R15 | Tcp (K) |
| EXAMPLE 58 | 0.3402 | 0.3529 | 91 | 74 | 80 | 90 | 78 | 91 | 95 | 91 | 5193 |

Example 59

In the example 59, the phosphor sheet was manufactured, with the phosphor mixture manufactured in the example 58 dispersed in the resin, and the white LED was manufactured by combining the phosphor sheet and the LED element.

First, a silicon-based resin was used as a resin, being a medium, and 10 wt % of phosphor mixture of the example 58 was dispersed in the resin and the phosphor sheet was thereby manufactured. Next, as shown by designation mark 1 of FIG. 15(C), the LED set on the LED element emitting the light with the wavelength of 405 nm with the phosphor sheet was manufactured. Then, when this LED was emitted, similarly to the example 58, the white light can be emitted.

BRIEF DESCRIPTION OF THE DRAWINGS

FIG. 9(A) shows a photograph with magnification of 250 and FIG. 9(B) shows a photograph with magnification of 1000.

DESCRIPTION OF SIGNS AND NUMERALS

Figure 1:
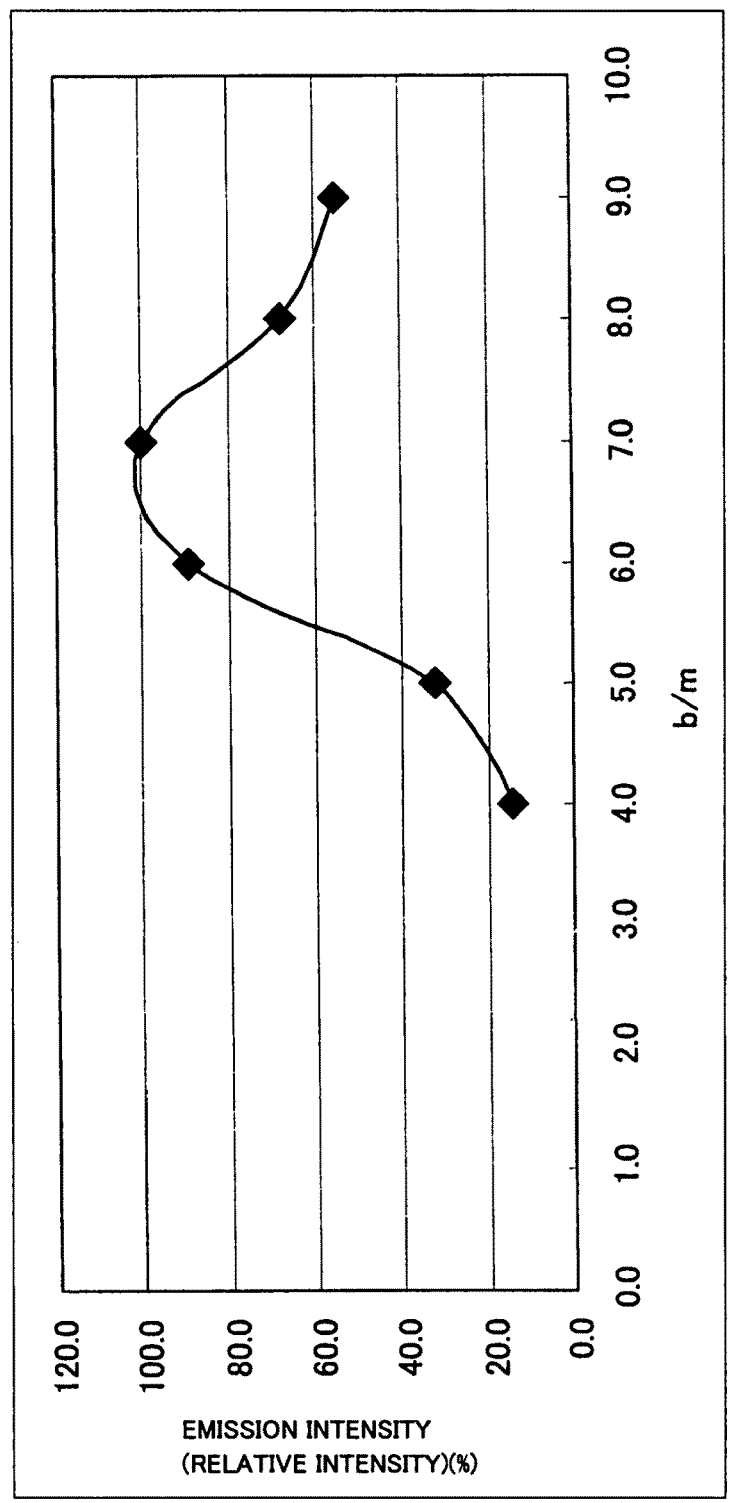
FIG. 1 is a graph showing a measurement result obtained by measuring an emission intensity of each phosphor of examples 1 to 6 and comparative examples 1 and 2.
Figure 2:
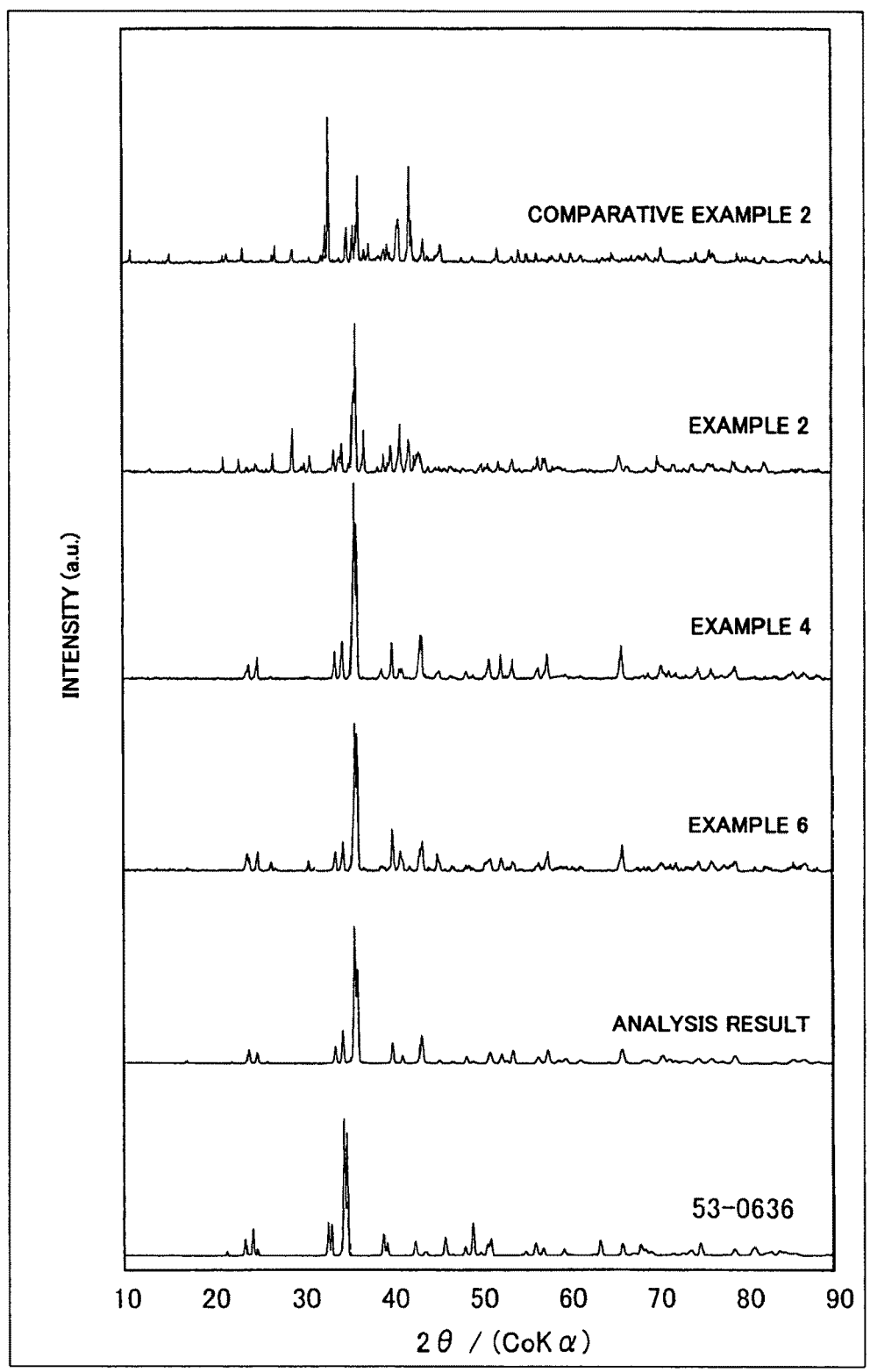
FIG. 2 is a graph showing the measurement result obtained by measuring an X-ray diffraction pattern by a powder method of each phosphor of examples 2, 4, 6 and the comparative example 2, and a diffraction pattern simulated based on a crystal structure of $Sr_2Al_2Si_{10}O_4N_{14}$ of JCPDS card (53-0636), and a simulation result obtained by performing Rietveld analysis of the X-ray diffraction pattern of the example 4.
Figure 3:
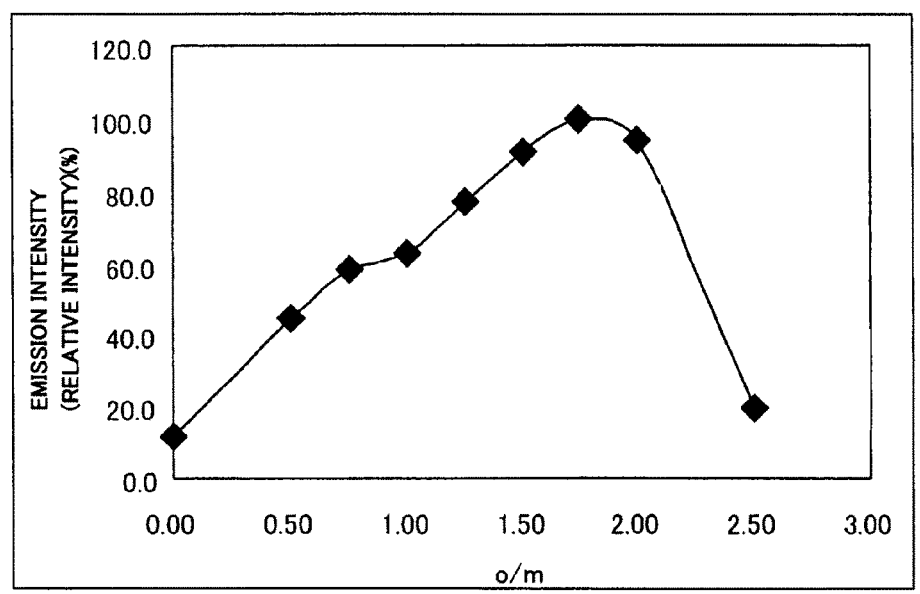
FIG. 3 is a graph showing the measurement result obtained by measuring the emission intensity of each phosphor of examples 7 to 15.
Figure 4:
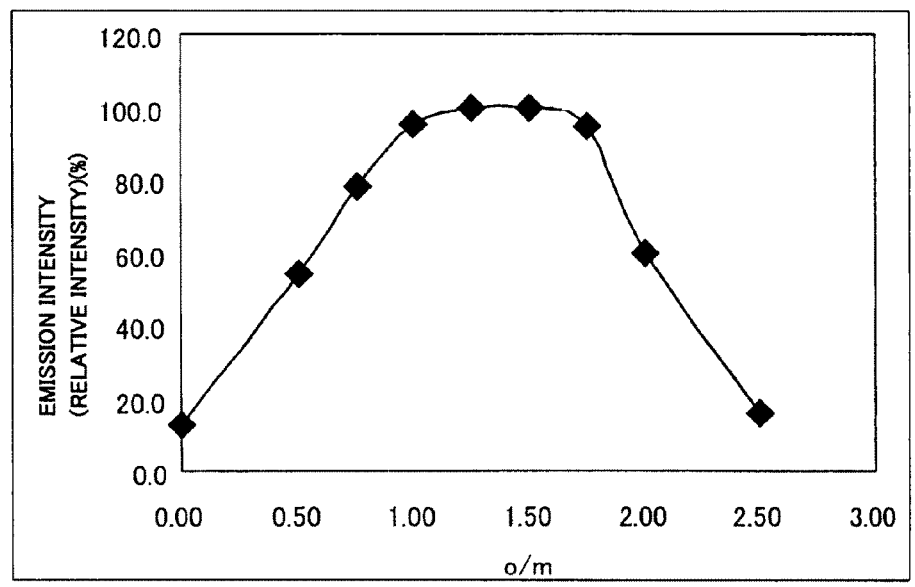
FIG. 4 is a graph showing the measurement result obtained by measuring the emission intensity of each phosphor of examples 16 to 24.
Figure 5:
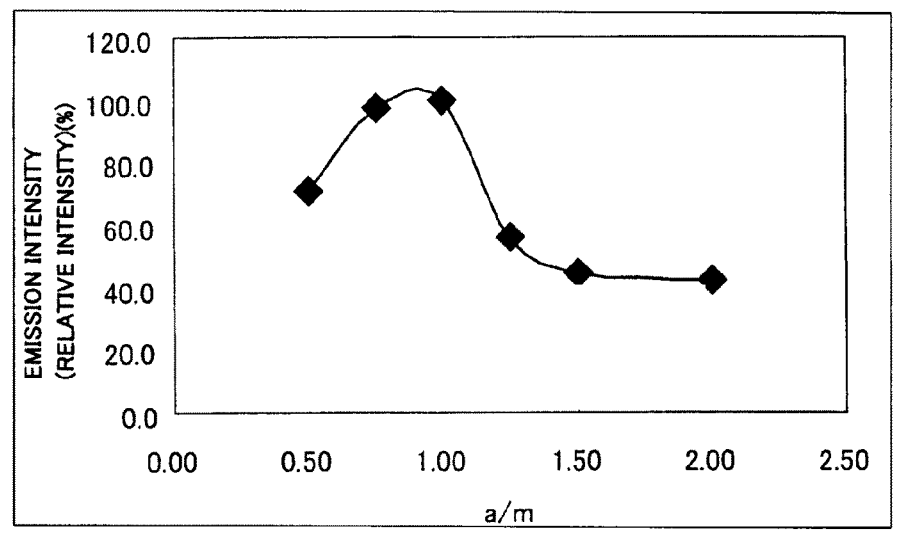
FIG. 5 is a graph showing the measurement result obtained by measuring the emission intensity of each phosphor of examples 25 to 30.
Figure 6:
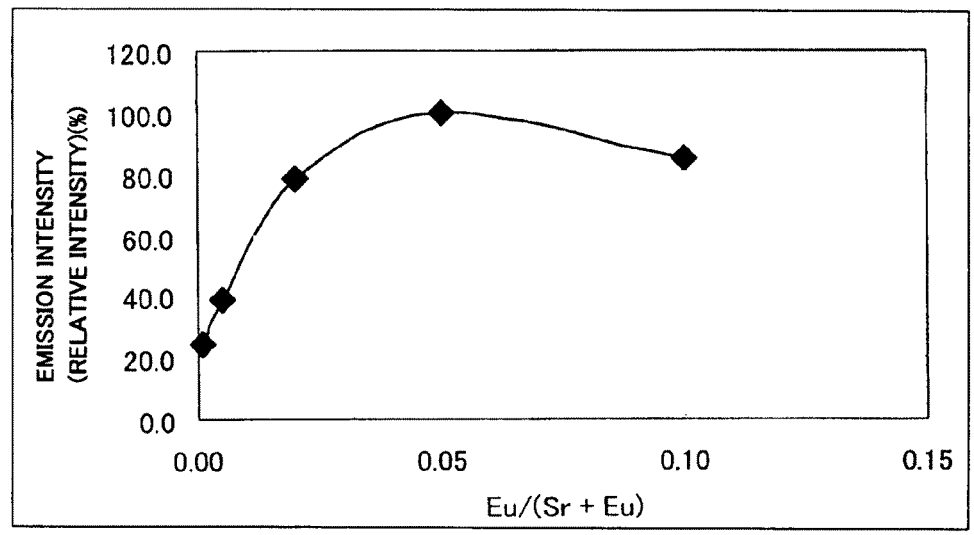
FIG. 6 is a graph showing the measurement result obtained by measuring the emission intensity of each phosphor of examples 31 to 35.
Figure 7:
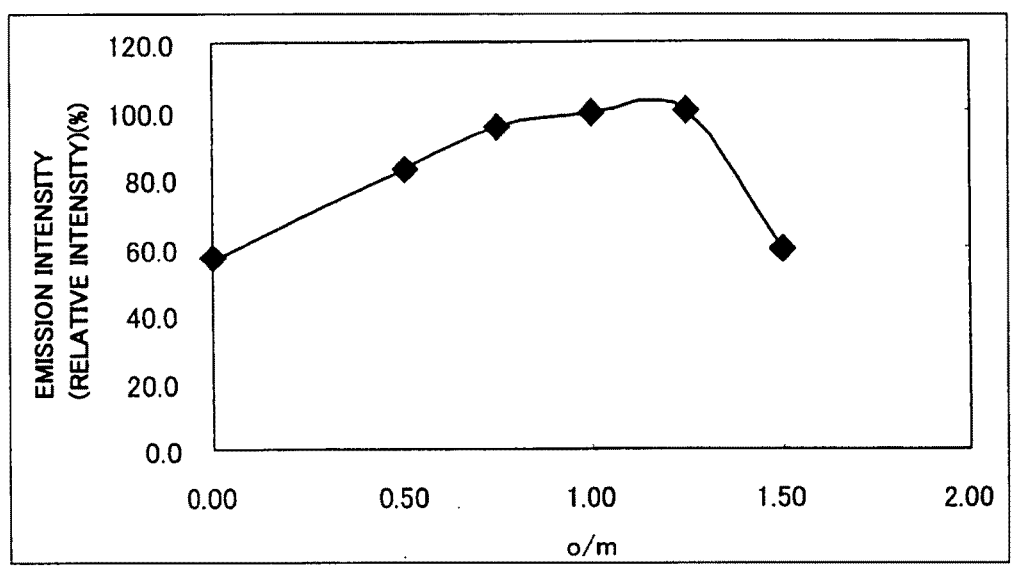
FIG. 7 is a graph showing the measurement result obtained by measuring the emission intensity of each phosphor of examples 45 to 50.
Figure 8:
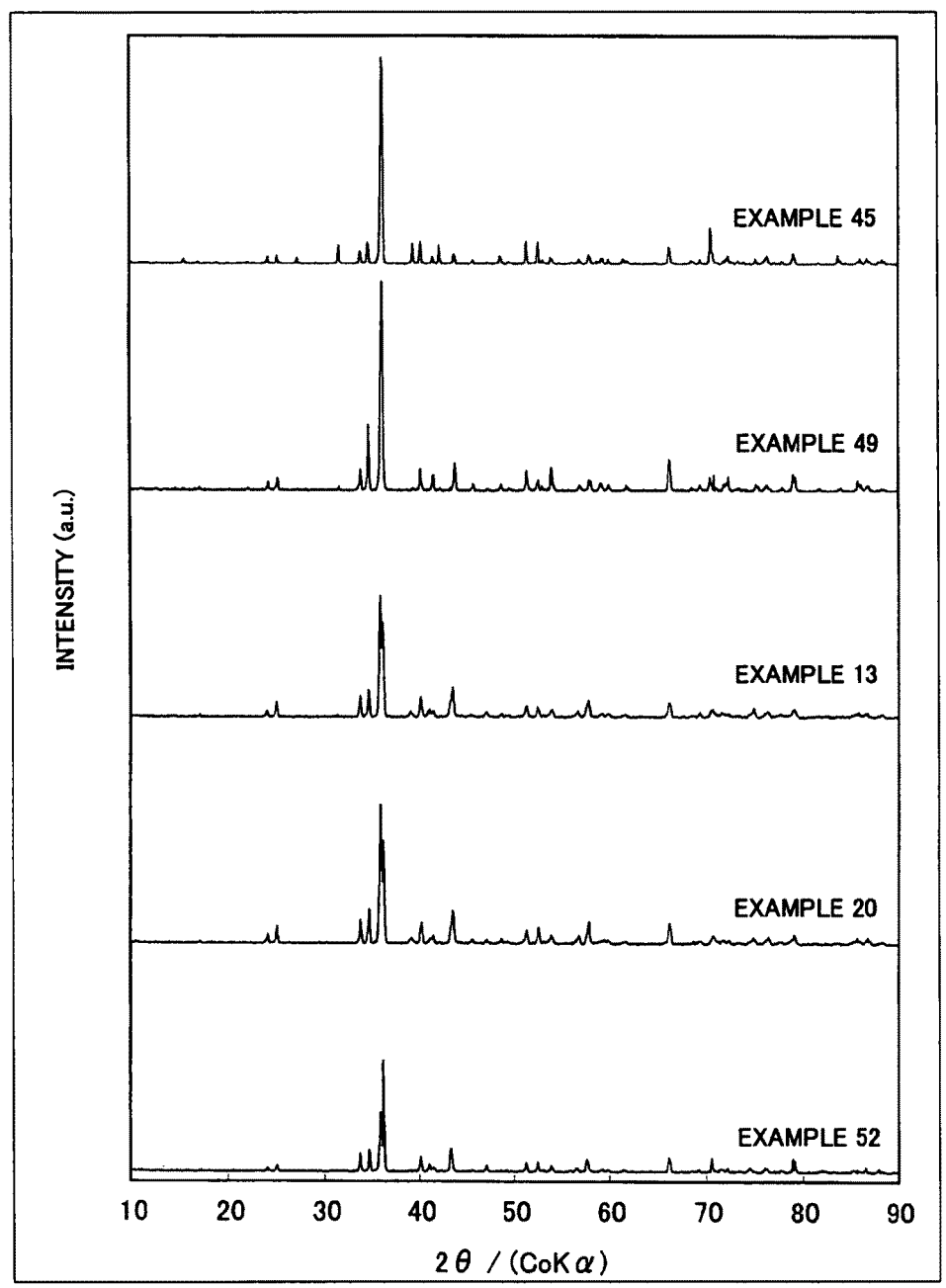
FIG. 8 is a graph showing the measurement result of the X-ray diffraction pattern by the powder method of each phosphor of examples 13, 20, 45, 49, 52.
Figure 9:
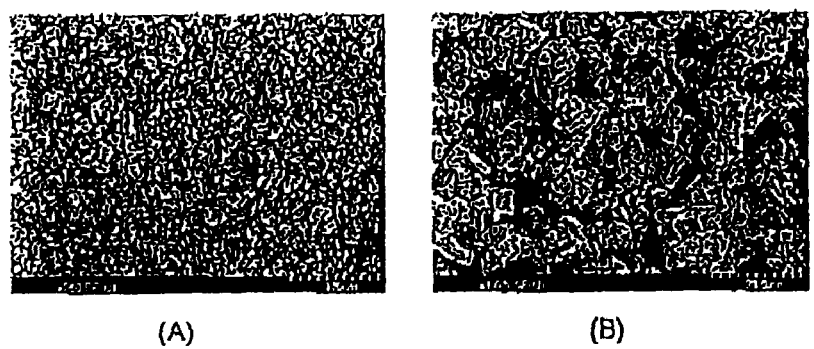
FIG. 9 is a view of an SEM photograph showing phosphor powders of the example 20.
Figure 10:
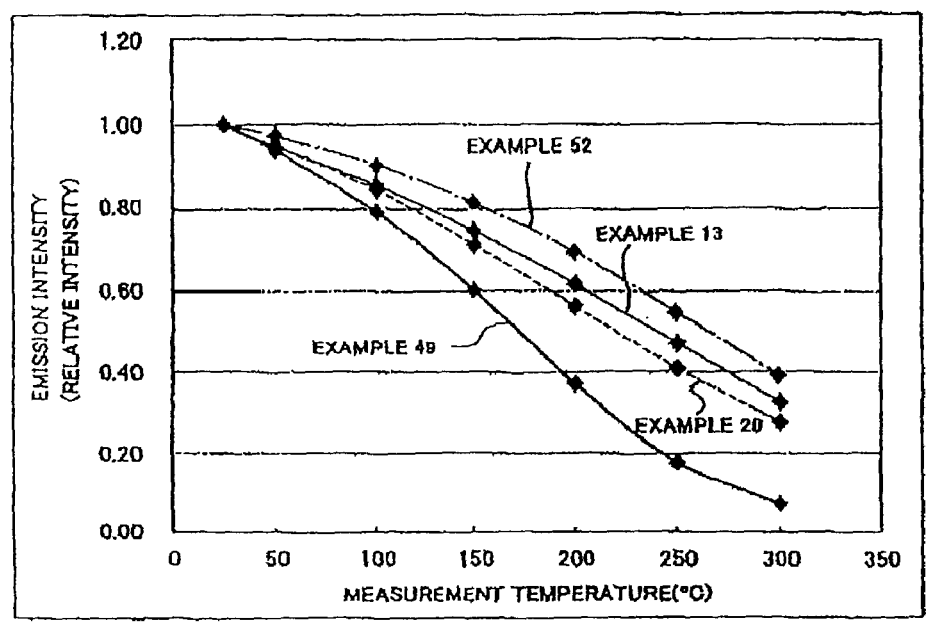
FIG. 10 is a graph showing a temperature characteristic of the emission intensity of each phosphor of the examples 13, 20, 49, 52.
Figure 11:
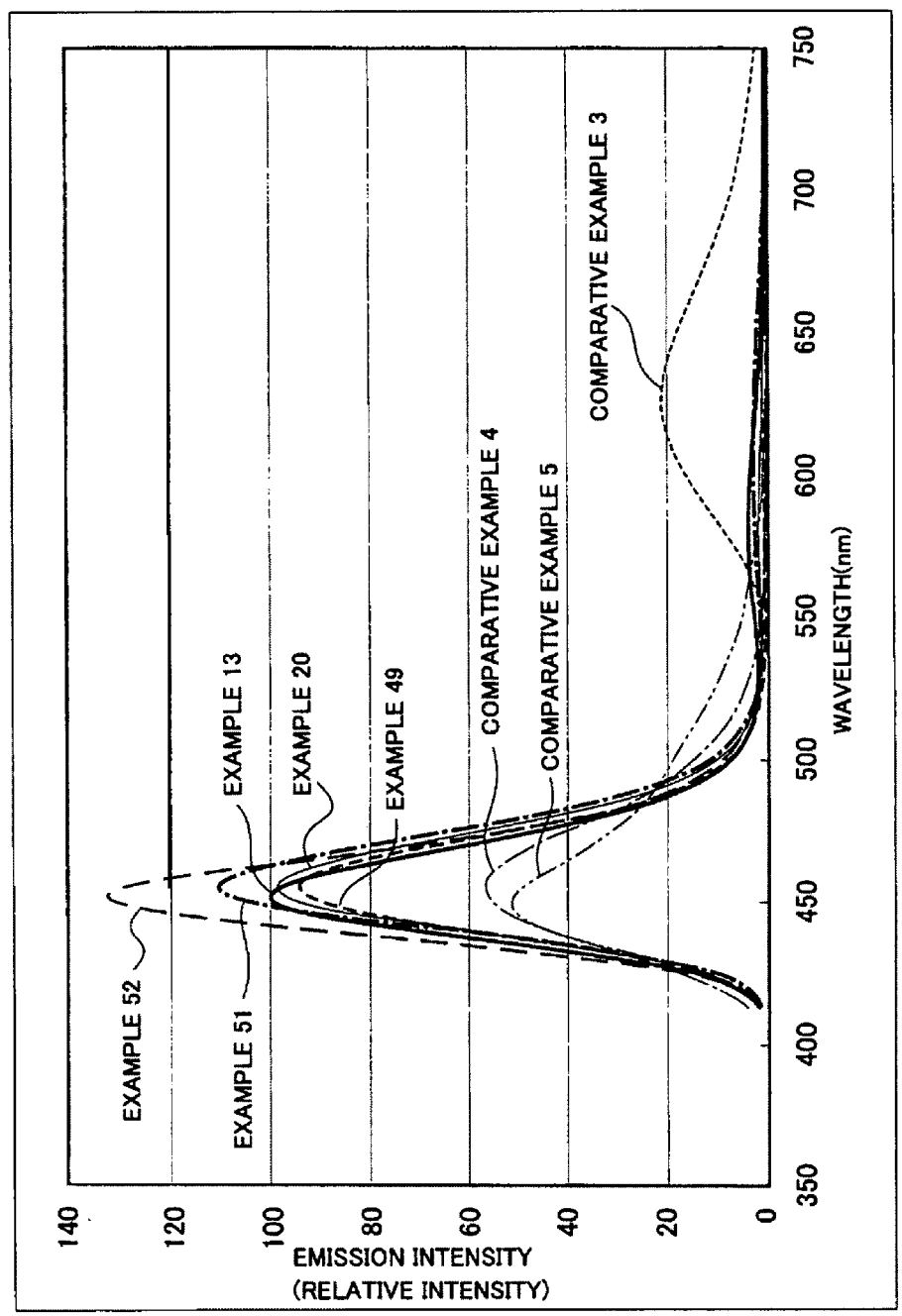
FIG. 11 is a graph showing an emission spectrum of each phosphor of the examples 13, 20, 49, 51, 52, and comparative examples 3, 4, 5.
Figure 12:
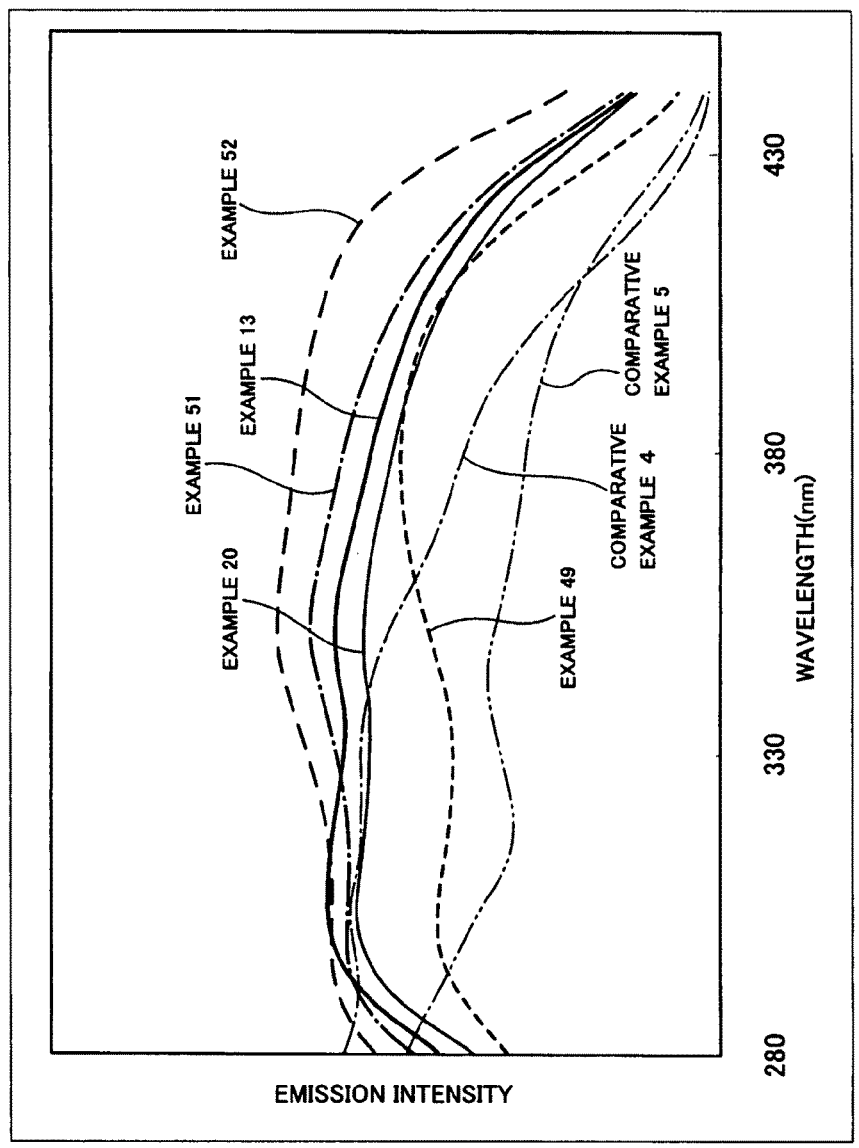
FIG. 12 is a graph showing an excitation spectrum of each phosphor of the examples 13, 20, 49, 51, 52, and comparative examples 4 and 5.
Figure 13:
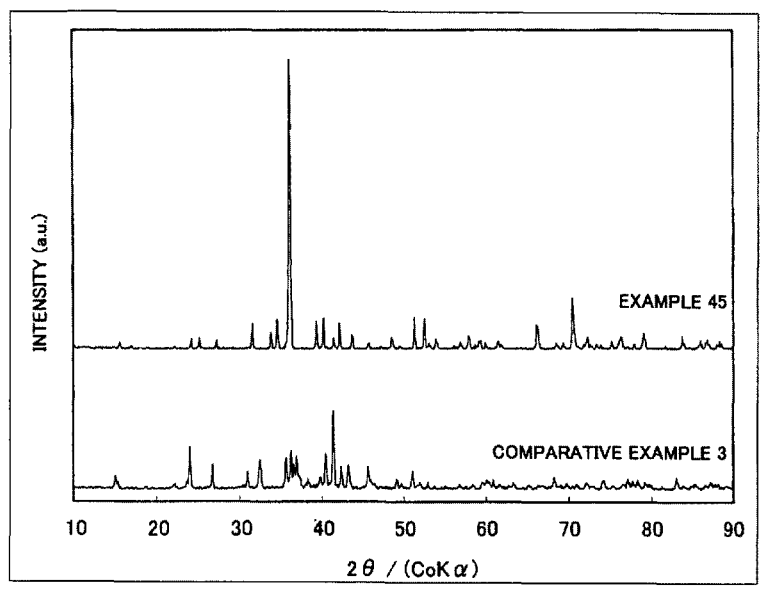
FIG. 13 is a graph showing the measurement result of the X-ray diffraction pattern by the powder method of each phosphor of the example 45 and the comparative example 3.
Figure 14:
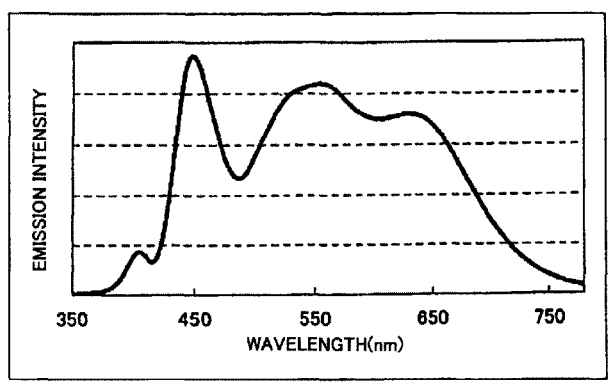
FIG. 14 is a graph showing the emission spectrum of a light emission device in which the phosphor mixture and the light emission part are combined.
Figure 15:
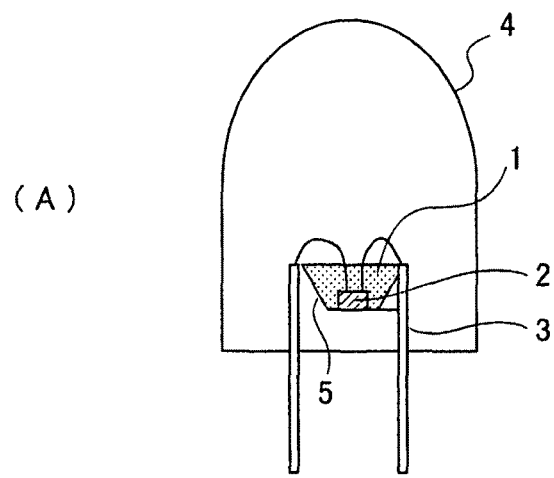
FIG. 15(A) to FIG.(C) are schematic sectional views showing examples of the light emitting devices.
Figure 15:
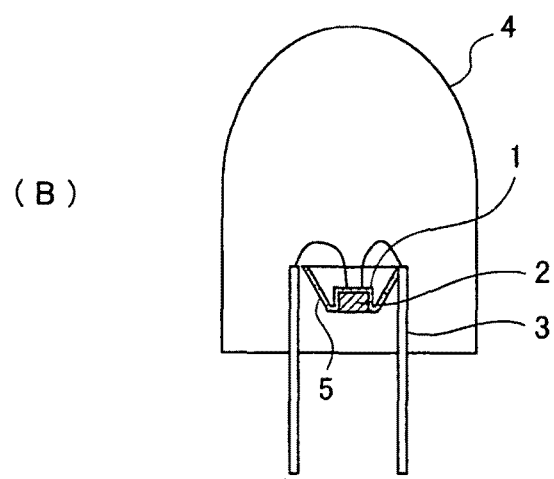
Figure 15:
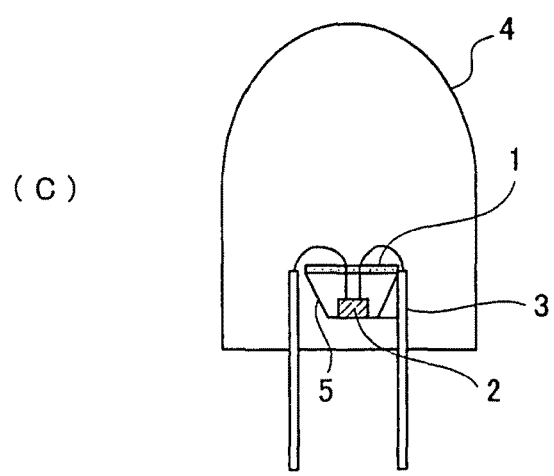
Figure 16:
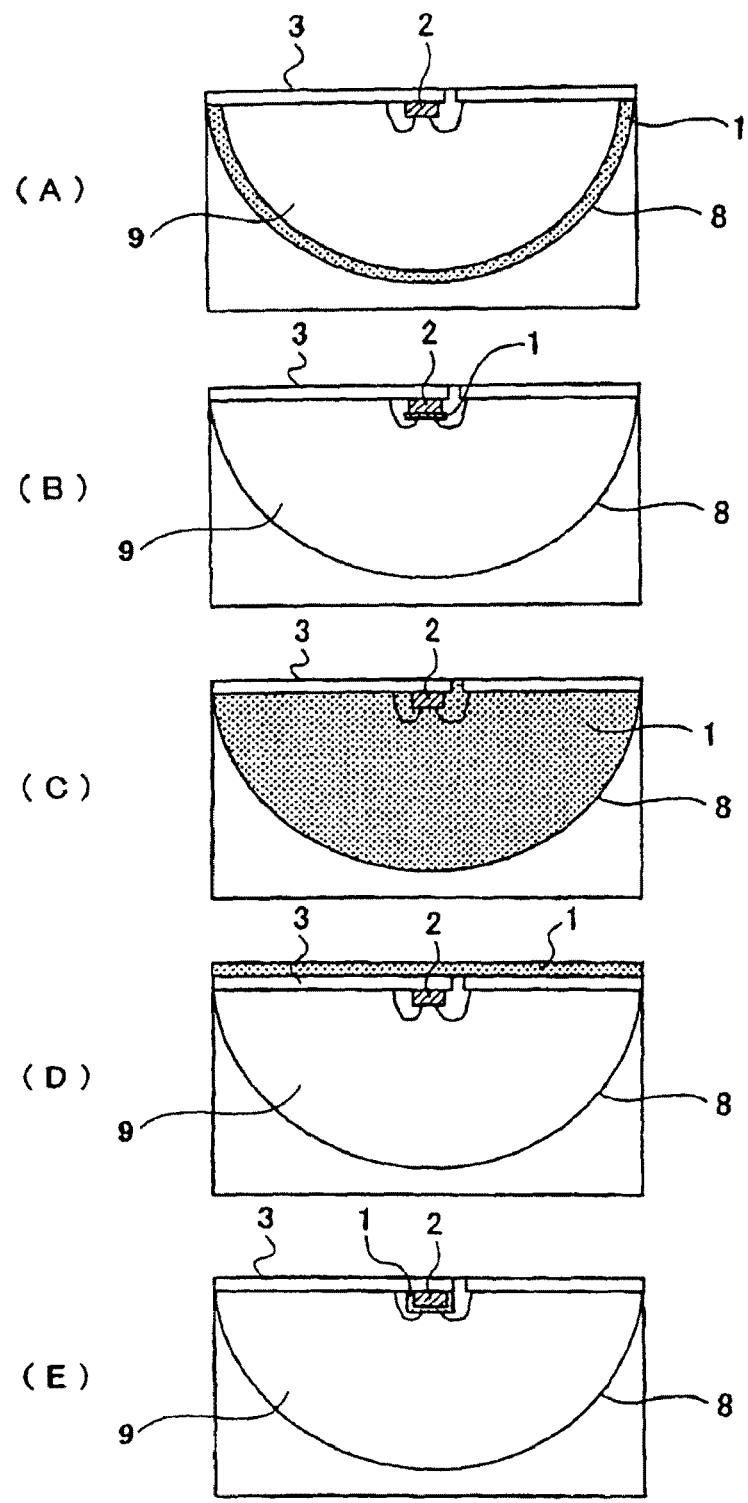
FIG. 16(A) to FIG. 16(E) are schematic sectional views showing examples of the reflective type light emitting devices.

1 Mixture
2 Light emitting element
3 Lead frame
4 Resin
5 Container
8 Reflecting surface
9 Transparent mold material

The invention claimed is:

1. A phosphor of the formula MmAaDbOoNn:Z, where element M is at least one kind of element having bivalent valency, element A is at least one kind of element having tervalent valency, element D is at least one kind of element having tetravalent valency, O is oxygen, N is nitrogen, and element Z is at least one kind of element acting as an activator, satisfying $5.0<(a+b)/m<9.0$, $0 \leq a/m \leq 2.0$, $0 \leq o \leq n$, $n=2/3m+a+4/3b-2/3o$, and having an emission spectrum with a maximum peak in the wavelength range from 400 nm to 500 nm under an excitation of the light in a wavelength range from 250 nm to 430 nm.

2. The phosphor according to claim 1, wherein $0.0 \leq a/m \leq 2.0$, $4.0 \leq b/m \leq 8.0$, $6.0 \leq (a+b)/m \leq 8.0$, and $0 < o/m \leq 3.0$.

3. The phosphor according to claim 1, wherein when $0 \leq x \leq 2$ is satisfied, a, b, o, n are expressed by $a=(x) \times (m)$, $b=(6-x) \times (m)$, $o=(1+x) \times (m)$, $n=(8-x) \times (m)$.

4. The phosphor according to claim 1, wherein under excitation by monochromatic light in the wavelength range from 350 nm to 430 nm, when a maximum emission intensity is defined as $P_{max}$ and a minimum emission intensity is defined as $P_{min}$ in the emission spectrum in the wavelength range from 400 nm to 500 nm, satisfying $P_{min}/P_{max} \geq 0.3$.

5. The phosphor according to claim 1, wherein the element M is at least one kind of element selected from a group consisting of Mg, Ca, Sr, Ba, Zn, and rare earth elements having bivalent valency, element A is at least one kind of element selected from a group consisting of Al, Ga, In, Tl, Y, Sc, P, As, Sb, and Bi, element D is at least one kind of element selected from the group consisting of Si, Ge, Sn, Ti, Hf, Mo, W, Cr, Pb, Zr, and element Z is at least one kind of element selected from the group consisting of the rare earth elements and transition metal elements.

6. The phosphor according to claim 1, wherein the element M is at least one kind of element selected from a group consisting of Mg, Ca, Sr, Ba, Zn, the element A is at least one kind of element selected from a group consisting of Al, Ga, and In, the element D is Si and/or Ge, and the element Z is at least one kind of element selected from the group consisting of Eu, Ce, Pr, Tb, Yb, and Mn.

7. The phosphor according to claim 1, wherein the element M is Sr, the element A is Al, the element D is Si, and the element Z is Eu.

8. The phosphor according to claim 1, wherein the general formula is expressed by MmAaDbOoNn:Zz, and the value of z/(m+z), which is a molar ratio of the element M to the element Z, is not less than 0.0001 and not more than 0.5.

9. The phosphor according to claim 1, containing Sr of 16.0 to 25.0 wt %, Al of 2.0 to 9.0 wt %, oxygen of 0.5 wt % to 11.5 wt %, N of 23.0 to 32.0 wt %, and Eu of 0 to 3.5 wt %, having an emission spectrum with a maximum peak wavelength in a range from 400 nm to 500 nm under an excitation of the light in the wavelength range from 250 nm to 430 nm.

10. The phosphor according to claim 1, wherein in an X-ray diffraction pattern by a powder method using CoKα ray, a diffraction peak with highest intensity is shown in a Bragg angle (2θ) range from 35° to 37°, and further in the Bragg angle (2θ) range from 23.6° to 25.6°, 33° to 35°, 39.7° to 40.7°, and 43° to 44° of an X-ray diffraction pattern, wherein two, two, one, and one characteristic diffraction peaks are shown respectively and when a relative intensity of the diffraction peak with highest intensity observed in the Bragg angle (2θ) range from 35° to 37° is defined as 100%, the relative intensity of the diffraction peaks is not less than 2.0%, and not more than 40%.

11. The phosphor according to claim 1, wherein a crystal of a product phase contained in the phosphor has an orthorhombic crystal structure.

12. The phosphor according to claim 1, wherein a unit volume of a crystal lattice of the product phase contained in the phosphor is 345 Å³ or more and 385 Å³ or less.

13. The phosphor according to claim 1, wherein a unit volume of a crystal lattice of the product phase contained in the phosphor is 353 Å³ or more and 385 Å³ or less.

14. The phosphor according to claim 1, wherein a lattice constant of the crystal lattice of the product phase contained in the phosphor is set, so that a is 7.85 Å or more and 8.28 Å or less, b is 9.26 Å or more and 9.58 Å or less, and c is 4.80 Å or more and 4.92 Å or less.

15. The phosphor according to claim 1, wherein a size (Dx) of a crystallite of the product phase contained in the phosphor powder is 50 nm or more.

16. The phosphor according to claim 1, wherein a size (Dx) of a crystallite of the product phase contained in the phosphor powder is 80 nm or more.

17. The phosphor according to claim 1, comprising primary particles having particle size of 50 μm or less, and an aggregate in which the primary particles are aggregated with each other, wherein an average particle size (D50) of a phosphor powder containing the primary particles and the aggregate is not less than 1.0 μm and not more than 50.0 μm.

18. A manufacturing method of the phosphor according to claim 1, comprising:
   obtaining a mixture by weighing and mixing raw material powders of the phosphor;
   obtaining a fired product by firing the mixture in a firing furnace; and
   obtaining a phosphor by pulverizing the fired product,
   wherein in obtaining the fired product by firing the mixture, any one of inactive gas, ammonia, mixed gas of the ammonia and the nitrogen, or mixed gas of the nitrogen and hydrogen is used as atmosphere gas during firing.

19. The manufacturing method of the phosphor according to claim 18, wherein gas containing 80% or more of nitrogen gas is used as the atmosphere gas in the firing furnace.

20. The manufacturing method of the phosphor according to claim 18, wherein in obtaining the fired product by firing the mixture in the firing furnace, firing of the mixture is performed twice, and between such firings, pulverizing and mixing of the fired mixture is performed.

21. The manufacturing method of the phosphor according to claim 18, wherein in obtaining the fired product by firing the mixture in the firing furnace, firing is performed, with 0.1 ml/min or more of the atmosphere gas flowing into the firing furnace.

22. The manufacturing method of the phosphor according to claim 21, wherein first, firing is performed, with 0.1 ml/min of the atmosphere gas flowing into the firing furnace, and next, firing is performed without flowing the atmosphere gas into the firing furnace.

23. The manufacturing method of the phosphor according to claim 18, wherein in obtaining the fired product by firing the mixture in the firing furnace, the atmosphere gas in the firing furnace is set in a pressurized state of 0.001 MPa or more and 1.0 MPa or less.

24. The manufacturing method of the phosphor according to claim 18, wherein a crucible composed of nitride is used as a firing crucible.

25. A phosphor sheet, wherein a phosphor according to claim 1 is dispersed in resin or glass.

26. An emission device, comprising a phosphor according to claim 1, and a light emitting part emitting light with a first wavelength, wherein the light with a wavelength different from the first wavelength is emitted from the phosphor, with a part or all of the light with the first wavelength as an excitation light.

27. The emission device according to claim 26, wherein the first wavelength is a wavelength of 250 nm to 430 nm.

28. The emission device according to claim 26, wherein a correlated color temperature of the emission device is in a range from 10000K to 2000K.

29. The emission device according to claim 26, wherein the correlated color temperature of the emission device is in a range from 7000K to 2500K.

30. The emission device according to claim 26, wherein an average color rendering index Ra of the emission device is 80 or more.

31. The emission device according to claim 26, wherein a special color rendering index R15 of the emission device is 80 or more.

32. The emission device according to claim 26, wherein the special color rendering index R9 of the emission device is 60 or more.

33. The emission device according to claim 26, wherein a light emitting part emitting light with the first wavelength is a light emitting element (LED).

* * * * *